: 5,555,371
: Sep. 10, 1996

[54] DATA BACKUP COPYING WITH DELAYED DIRECTORY UPDATING AND REDUCED NUMBERS OF DASD ACCESSES AT A BACK UP SITE USING A LOG STRUCTURED ARRAY DATA STORAGE

[75] Inventors: Linda Marie Duyanovich, Saratoga, Calif.; William Frank Micka, Tucson, Ariz.; Robert Wesley Shomler, Morgan Hill, Calif.

[73] Assignee: International Business Machines Corporation, Armonk, N.Y.

[21] Appl. No.: 276,379

[22] Filed: Jul. 18, 1994

Related U.S. Application Data

[63] Continuation-in-part of Ser. No. 36,017, Mar. 23, 1993, Pat. No. 5,446,871, and Ser. No. 992,219, Dec. 17, 1992.

[51] Int. Cl.[6] .................................................... G06F 11/34
[52] U.S. Cl. ........................................................ 395/182.11
[58] Field of Search .................................... 395/575, 425, 395/182.11, 489; 371/40.1, 61, 62, 2.1, 2.2, 10.1

[56] References Cited

U.S. PATENT DOCUMENTS 5,214,670  8/1993  Eastridge et al. ...................... 395/575

Primary Examiner—Robert W. Beausoliel, Jr.
Assistant Examiner—Phung Chung
Attorney, Agent, or Firm—F. E. Anderson; D. A. Shifrin; H. F. Sommermeyer

[57] ABSTRACT

Primary and secondary data processing systems are coupled via a communication system. Data storage in both systems is provided by a log structured array (LSA) system that stores data in compressed form. Each time data are updated within LSA, the updated data are stored in a data storage location different from the original data. Selected data recorded in a primary data storage of the primary system is remote dual copied to the secondary system for congruent storage in a secondary data storage, such as for disaster recovery purposes. The primary systems creates a remote copying session. Within such remote copying session, a series of "pending write update" sessions are ESTABLISHED. All data updated within each pending write update session is a consistency group of data. Within each pending write update session update data are retentively stored in both the primary and secondary systems (such as in a non-volatile cache). Addressability of such update data within a pending write update session is through separate pending write directories. The main (primary and secondary) directory for data is not updated such that all original (not updated) data are addressable. A COMMIT command terminates each pending write update session. Congruence of the sequence of updating in the primary system is maintained in the secondary system updating procedure.

28 Claims, 12 Drawing Sheets

SECONDARY DATA STORAGE OPERATIONS
DURING DATA UPDATE

FIG. 8

| TIME STAMP VALUE TS | SEQUENCE NUMBERS | | | | |
|---|---|---|---|---|---|
| | SS-A | SS-B | SS-C | SS-D (a) | SS-E (b) |
| 05300 | | | | >75(c) | |
| | | | | | |
| 11001 | | | 380 | | 401(g) |
| 11005 | 121 | | | | |
| 11006 | | >15(e) | 381 | | |
| 11040 | | | >382(f) | | |
| 11100 | 122 | | | | |
| 11200 | 123 | | | | |
| 11210 | | 16(i) | | | 402 |
| 11215 | | 17 | | | |
| 11220 | | 18 | | | |
| 11350 | >124(d,i) | | | | |
| 11375 | 125 | | 383 | | 403 |
| | | | | 75(h) | |

SS -- SUBSYSTEM
(DATA PATH)

NVCACHE — NONVOLATILE CACHE
NVRAM — NONVOLATILE RAM
RAM — RANDOM ACCESS MEMORY
PWR — POWER SOURCE
SS — SUBSYSTEM

SECONDARY HOST OPERATIONS

SECONDARY DATA STORAGE OPERATIONS DURING DATA UPDATE

DATA BACKUP COPYING WITH DELAYED DIRECTORY UPDATING AND REDUCED NUMBERS OF DASD ACCESSES AT A BACK UP SITE USING A LOG STRUCTURED ARRAY DATA STORAGE

RELATED APPLICATIONS

This application is a continuation-in-part of the below-identified copending commonly-assigned applications for patent:

Ser. No. 08/036,017, filed Mar. 23, 1993, Shomler et al, now U.S. Pat. No. 5,446,871, and Ser. No. 07/992,219, filed Dec. 17, 1992, Micka et al.

DOCUMENTS INCORPORATED BY REFERENCE

The related parent applications identified above are both incorporated herein by reference.

FIELD OF THE INVENTION

This invention relates to data preservation for data stored in a primary data-storage system of an information handling system by contemporary asynchronous non-disruptive data backup copying (also termed remote dual copying or duplexing) data records to a secondary independent data storage unit. Such independent data-storage system may be at a physically remote data processing location.

BACKGROUND OF THE INVENTION

It is important to provide either a local and/or a remote contemporary asynchronous copying capability of data for real-time backup protection of data stored in a data processing installation, such as in peripheral data storage. Backing up or copying to a remote data center provides for physical disasters not protected by a local back up copy, even to an independent data-storage system. This automatic data copying is referred to as remote duplexing or remote data copying. It is important to have this type of automatic service for disaster data backup. Most users want this automatic backup capability to be direct access storage device (DASD) storage based and application independent and to be independent of application program execution.

Such data preservation uses either synchronous or asynchronous copying. Synchronous copying requires that both the primary and secondary copies of data be retentively stored before an indication is given to the writing host processor that the data are retentively stored. Asynchronous copying merely requires that the data are retentively stored in a primary systems data storage. The back up storage proceeds independently of the primary data storage completion. Usually such back up is timely completed using contemporary asychronous remote data copying. Such remote copying is of special significance where it is anticipated that data copied and stored at a remote site would be the repository for any continued interaction with the data should the work and data of a primary site become unavailable. The factors of interest in copying include the protection domain (system and/or environmental failure or device and/or media failure), data loss (no loss/partial loss), time where copying occurs as related to the occurrence of other data and processes (point in time/real time), the degree of disruption to applications executing on said computer, and whether the copy is application or storage subsystem based. With regard to the last factor, application based copying involves log files, data files, program routines while storage based copying involves an understanding of DASD addresses and data set identifiers. Another factor is minimal interference of such remote data copying with usual day-to-day data processing operations. It is therefore desired to provide an efficient apparatus and method for remote data copying meeting the above-stated needs.

Copying data from a primary system to a remote secondary system asynchronously and independently from primary site data processing operations involves an appreciation of how write update operations are generated at a primary system. In this regard, a primary site includes one or more applications concurrently executing on a processor in which each application generates what is termed "application dependent writes". That is, the storage subsystem has no knowledge or awareness of the write operations or their queued scheduling to be invoked or called via the operating system. Varying delay is endemic. Applications do not write merely to a single or the same DASD. Indeed, they may cluster their writes in differing patterns such that both the queue length and the queue service rate vary among the DASD storage devices for both initial write and copy generating purposes. This means that the copies received at the remote site have a reasonably high probability of being in an out-of-order sequence much of the time and subject to delay or loss.

Asynchronously and independently executing applications and processors create a stream of write operations against local storage and remote sites, which stream is both queued and executed at different rates resulting in a near random ordered copy sequence. Since such data streams may contain large quantities of data, it is desired to minimize negative impacts on operation of primary and secondary data processing systems/sites by quickly retentively storing data (removing the data from the memory of host processors) while keeping the primary updating sequence intact at a secondary system/site. Updating directories and real data-storage devices based on asynchronous data transmissions is not desired because the sequence of primary system/site updating is not preserved. Therefore, it is desired to maintain addressability of all data while deferring directory updating to ensure maintenance of updating sequence at a remote or secondary system/site. It is also desired to minimize a number of DASD accesses to effect remote dual copying of a large plurality of data records.

At the secondary system the dual or secondary copy is retentively stored as soon as possible for reducing any risk of loss. This secondary retentive storage is independent of the sequence of updating in the primary system. The primary system determines when the secondary system is to arrange the data to preserve the critical updating sequence integrity. Then the secondary system sorts the received update indications of data in accordance with the primary system indicated update sequence for finding the last valid copy of each data record. Then the secondary system reads the valid copy of data from its data-storage system, arranges same in proper address sequence, then stores the data on the secondary DASD for retentive storage. Then all of the previous updates are erased (addressability is removed for an effective erase). Such secondary system back up requires up to three DASD accesses. One DASD access is required to initially retentively store all updates of the data. A second DASD access reads the valid data. Any outdated data is not read, but is erased (remove addressability for example) The third DASD access stores the valid data in a proper sequence. The first and second DASD accesses could be avoided by retentively storing all update data (even that update data that are to be discarded) in a non-volatile cache. Such avoidance may be more expensive to implement. Such multiple DASD accessing is desired to be reduced to but one DASD access without requiring intermediate caching for retentively writing the updated data in the secondary or back up data-storage system.

DISCUSSION OF THE PRIOR ART

As set forth below, the prior art is replete with methods and means for backing up and/or duplexing data for recovery and archiving purposes. While some inconsistency between an original and copied data set might be tolerable in some selected situations, it is the ignorance of the occurrence of missing data that makes such fuzziness unacceptable. That is, fuzziness of a copy set means that a recovery process cannot determine the state of the data copy.

One prior art method for generating consistent backup data involves copying a portion of DASD stored data onto magnetic tape once a day (point in time copying) and transporting the tape media to a distant location via truck. Thus, truck transport of tape copied data (assume each tape reel storing 200 megabytes of data, if moved by a truck carrying 200 such tape reels to a remote site 50 miles away from the primary in say one hour) would be communicating at an average rate of 40000 MB per 3600 second or 4,444 megabytes per second. Such data duplexing practice circa the 1950's was totally application disruptive. Furthermore, it offered at best inconvenience and a day's worth of difference in data state between the primary and remote sites.

Another known method involves use of telecommunications (such as T1 lines) for moving the backup copy. More time-current, even up-to-the-minute remote copies are offered by some data base management systems (IMS, DB2). While such remote copying occurs in real time, it however relies upon an application based rather than a storage based copy as communicated over a continuously available dedicated path between sites.

Cheffetz et. al., U.S. Pat. No. 5,133,065 "Backup Computer Program for Networks", issued Jul. 21, 1992 discloses a local area network (LAN) having a file server to which each local node creates and transmits a list of local files to be backed-up. Such remote generation is for the purpose of reducing the traffic occasioned where a network server initiates the list creation and file copying activity. Arguably, art prior to this reference taught centrally administered file selection. This resulted in compromises to local node security and overuse of the server. This problem is presumptively avoided by Cheffetz's local node generated lists and remission of the lists to the file server.

Cheffetz sets out a form of point in time copying with some concern for balancing loads and security. However, there is no provision for data integrity i.e. accounting for any fuzziness in the data actually copied by the file server.

A Method and Means for Time Zero Backup Copying of Data (hereinafter referred to as Time Zero Backup), teaches the backup copying of designated data sets representing point in time consistency in a CPU on an DASD storage subsystem concurrent with CPU application by suspending execution only long enough to form a logical to physical address concordance and thereafter physically backing up the data sets on the storage subsystem on a scheduled or opportunistic basis.

Time Zero Backup advantageously provides point in time copying of selected storage based data sets on an non-application disruptive basis. Nevertheless, the shortcoming is that in point of time data would arrive at the remote site as a snapshot of data as of the time the concurrent copy started. This represents a data state many hours earlier than subsequent data updates. Note, asynchronous remote data duplexing is a copy operation occurring in real time in which updates are being continuously sent ahead. Time Zero Backup requires multiple DASD accesses for effecting the remote copying of data at the secondary site or system. It is desired to avoid such multiple DASD accesses at the secondary or copy-to system.

Dishon et al, U.S. Pat. No. 4,862,411, "Multiple Copy Data Mechanism on Synchronous Disk Drives", issued Oct. 29, 1989, ensures a dual copy by causing parallel write paths to a DASD pair to be synchronized independently of the Channel Command Word (CCW) chain and avoids the single control unit dual copy path such as is shown in Crockett et al, U.S. Pat. No. 4,837,680, "Controlling Asynchronously Operating Peripherals", issued Jun. 6, 1989. In such systems as the IBM S/370 and the like, a virtual computer termed "channel" was used to manage the path establishment and data transfer between the CPU main memory and external storage. Control was expressed in the form of channel control words (CCW's) communicated by the channel to the control unit of external storage for interpretation and execution. Again, the secondary site copying process requires multiple DASD accesses for making a data recovery useful dual copy of the data.

Dishon exemplifies real time, non-application disruptive copying which preserves data against media or device failure but does not treat system or environmental failure such as would be occasioned by a failed primary site.

Beale et al, U.S. Pat. No. 5,155,845, "Data-storage system for Providing Redundant Copies of Data", issued Oct. 13, 1992, dual copies variable length records (CKD) on two or more external stores by causing a write operation to be processed by the first storage controller and communicated in parallel over a direct link (broad band path) to a second storage controller. This obviates the path length limitation between a primary and a remote copy site. Such a limitation is occasioned by the fact that CKD demand/response architecture is length (bandwidth) limited to a range approximating 150 meters.

Beal in the manner of Dishon treats real time, non-application disruptive dual copying which preserves data availability only in the presence of device or media failure.

Hartung in U.S. Pat. No. 4,574,346 shows a DASD data storage subsystem in which diverse classes of data are stored. In a USE exemption class, data are not immediately stored in DASD. Rather, USE exempted data are stored primarily in a volatile cache as an exemption from retentively storing data. All other data are primarily stored in DASD. A practical effect of such classes is that the subsystem for exempted data need not store data on DASD. This exemption speeds up response to a remote terminal, for example. A COMMIT removes the USE exemption for specified data. The updated data are not retentively stored for reducing DASD accesses. It is desired to retentively store data as soon as possible for reducing risk of data loss.

Hartung also shows a peripheral cache having a cache directory. If data are promoted to the cache from DASD, then the cache is accessed using the DASD address translated to a cache address. Updated data stored in the cache are moved to the DASD based on least recent usage, command from a host system indicating that data are to be written to DASD, before the end of a write operation when the updated data are not exempt from retentive storage requirements and the like. Such controls are suitable within a given peripheral data storage subsystem.

Hartung et al in U.S. Pat. No. 4,636,946 describe a peripheral cache cast out control. If any data element in cache is to be cast out to DASD, then the peripheral controller examines a least recent usage (LRU) list for other data not ready for cast out but that would be stored in a same DASD cylinder as the cast out data. For reducing a number of DASD accesses, all data in CACHE storable in that one cylinder are copied to DASD. Only the data to be cast out are erased from the peripheral cache.

Anderson et al U.S. Pat. No. 4,958,273 shows plural processor groups having separate power supplies. The processors in each cluster can access data stored in that cluster. Identical copies of system information is maintained in all clusters. Each time the system information is updated in any cluster, that update is made in data storage in all clusters. Such an arrangement can be used in the present invention for updating a directory shared by several controllers. Such a shared directory provides addressability to stored data in devices attached to all or some of the several controllers.

Berger et al in U.S. Pat. No. 5,051,887 show remote dual copy procedures effected without changing any current system or application software in data processing systems. The procedure maintains status information for each record in the data storage devices. A joint array structure routes host requests for information to and from a correct data storage device while keeping status information concerning the data storage devices. The present invention is an improvement on this dual copy system.

SUMMARY OF THE INVENTION

An object of this invention is to provide dual copying of data from a primary data-storage system in a manner to limit a number of DASD accesses required in a secondary data-storage system while maintaining data update sequence integrity and retentively storing updates as soon as possible, then to later atomically update a secondary data storage directory in the secondary system.

It is a specific object of this invention to enable dual copying data using but a single DASD access to the dual copy or secondary data-storage system for storing data in the secondary data-storage system.

It is another object of the invention to store data in a secondary data center by first retentively storing all dual copy data irrespective of update sequencing, then later change the directory entries to reflect the update sequencing without reading nor re-writing the retentively stored data.

Apparatus and method of this invention transfer data from a first data-storage system to a second data-storage system in an asynchronous manner while, based on predetermined criteria, after a predetermined time or event update a directory in the second data-storage system while using minimal data-storage system DASD accesses. The first data-storage subsystem store data in a plurality of addressable data-storage locations. A first primary directory in said first data processing system is connected to the first data storage subsystem for indicating first predetermined ones of said data-storage locations that currently store data. The primary data storage copies predetermined data to a secondary data-storage system for backup and recovery. The copying of data does not necessarily follow the updating sequence in the primary data-storage system. Ancillary indications supplied with the copies indicate a time of updating such data in the primary data-storage system.

The second data-storage system either in said first or second data processing system, stores data in a plurality of second addressable data-storage locations. A secondary directory in said second data processing system is connected to the secondary data-storage system for addressably accessing the second addressable data-storage locations. The storage of the copied primary data storage data and indications in the secondary data-storage system results in not updating the secondary directory. Rather, a pending write update directory in said secondary data-storage system indicates stored ones of said copies of the primary data storage data in a sequence as received and not as updated in the primary data-storage system. Provision is made for storing said time of updating indications as being associated with the respective copied data.

Consistency means connected to the secondary data-storage system indicates to the secondary data-storage system that the stored copies of data are to be made addressable via said secondary directory. Such deferral of secondary directory updating minimizes accesses to DASD in the secondary data-storage system, for example. Such deferred directory updating also provides an atomic directory update of each consistency group in a dual copy environment. Before updating the secondary directory, all of the last updated copies of last updated data in the primary data-storage system are identified using the time of updating indications. Then the secondary directory is updated to make such copies of last updated data addressable in the secondary data storage without moving any data. Copies of data updated earlier than the last updated data are not addressable, but still may be stored in the secondary data storage until later removed. Completeness of the data copying from the primary to the secondary data storage is indicated by sequence numbers identifying each and every sequence of data updating in the primary data-storage system of the data to be copied to the secondary data-storage system.

In a preferred aspect of this invention, the secondary data-storage system uses a log structured array (LSA), or any equivalent, for storing data and establishing addressability of stored data. This LSA enables an enhanced control for remote data copying with deferred directory updating. Such enhancement includes immediately retentively storing updated data without altering nor updating LSA (DASD) directories in the secondary system. Later, when the consistency means determines that all of the updates are complete to the primary data-storage system, then the secondary LSA (DASD) directory is updated as of a predetermined time stamp value. This action effects an atomic directory update for all updated data in the secondary system.

It is also preferred that a copy session be established between the primary and secondary data-storage system. Such copy session is divided into pending write update sessions in which such data copying is asynchronously effected without regard to maintaining the copying sequence that replicates the data updating in the primary data-storage system.

The foregoing and other objects, features and advantages of the invention will be apparent from the following more particular description of preferred embodiments of the invention, as illustrated in the accompanying drawings.

DESCRIPTION OF THE DRAWING

FIG. 8 is a chart showing sequence numbers and time stamps (time of updating indication) usable in the systems shown in FIG. 1 for maintaining congruence of data updating sequences in primary and secondary systems.

DETAILED DESCRIPTION

Figure 1:
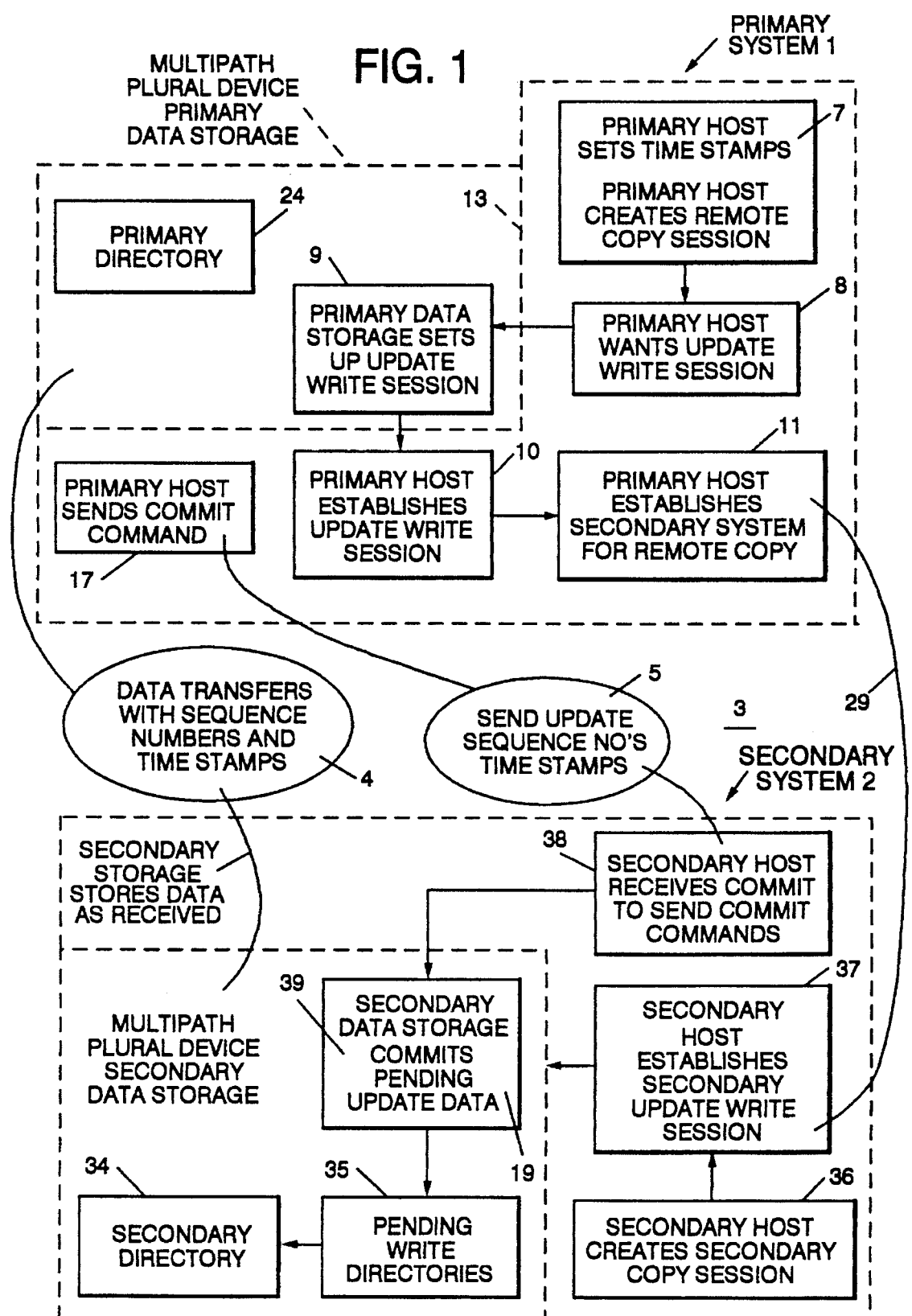
FIG. 1 diagrammatically illustrates primary and secondary data processing systems employing the present invention for enhanced remote data copying.
Figure 2:
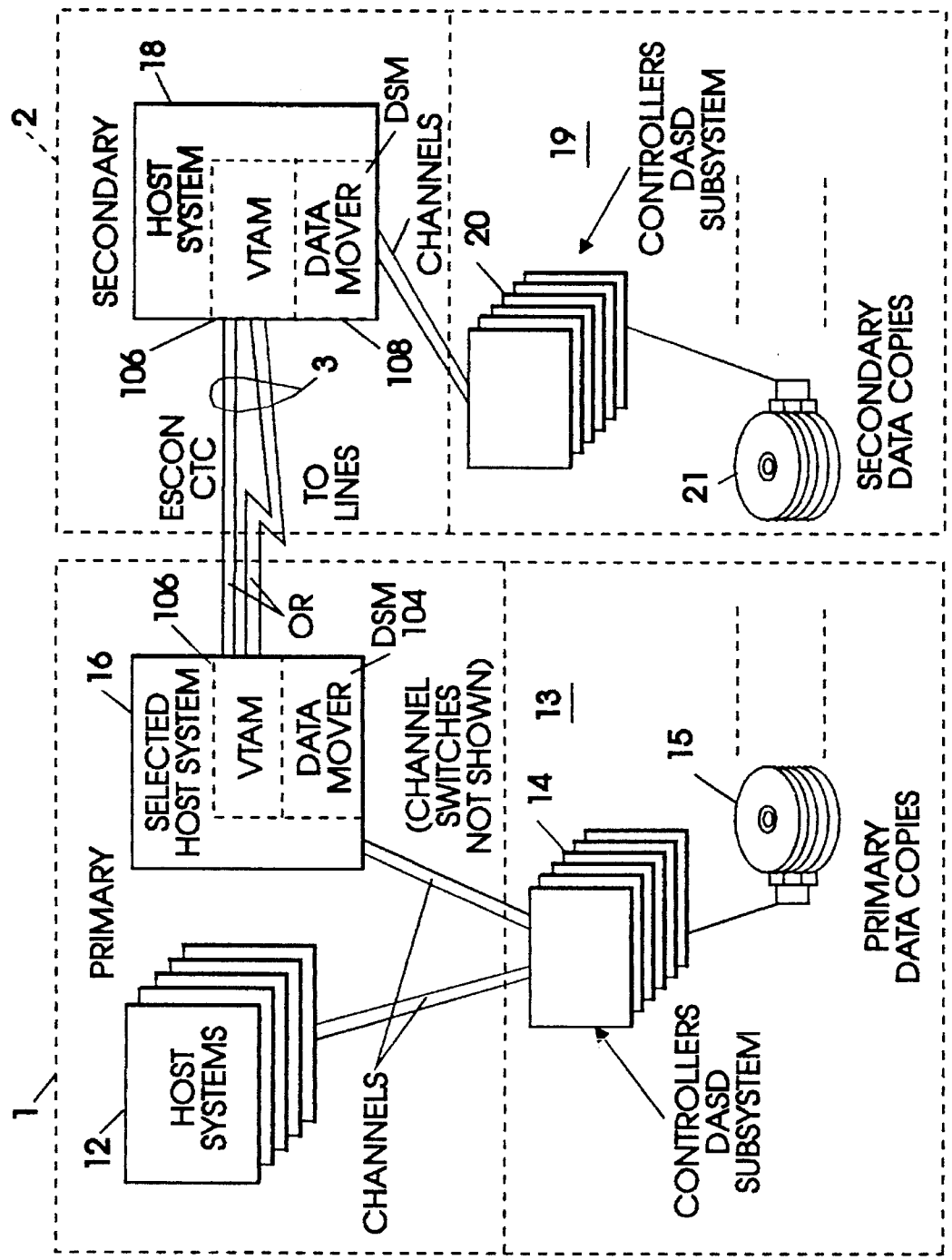
FIG. 2 is a block diagram showing an implementation of the invention in a preferred embodiment.

Referring now more particularly to the appended drawing, like numerals indicate like parts and structural features in the various figures. FIG. 1 shows a conceptualization of the invention in a best mode. Primary data processing system 1 generates data that are to be backed up for disaster recovery purposes. Secondary data processing system 2 receives such data for disaster back up and recovery. Recovery from a disaster is not a part of this description. Primary and secondary systems 1 and 2 cooperate to automatically and asynchronously transfer data for backup. System inter-connection 3 operatively couples primary system 1 and secondary system 2 for effecting remote dual copying as described herein. System inter-connection 3 is best seen in FIG. 2. Since copying data to a back up recovery site is done more than recovery, it is desired to make such copying most efficient. Such copying copies all data that is updated, that is data are addressable in data units, such as data bytes of a record that is in a file. Each such data unit may be updated a plurality of times during an update session. Only the most recent update for each data unit is valid, therefore in the secondary system only the most recent copy of each data unit should be stored for recovery. Such a requirement makes the two copies of all data to be congruent and have only valid data.

According to this invention, the maximum number of required DASD accesses (a time consuming operation) in the secondary data-storage system is limited to but one DASD access for recording each update data copy for each data copy of each data unit. Prior to this invention, up to three DASD accesses were required to completely dual copy update data in a secondary system.

Robert Shomler, one of the inventors of this invention, describes principles of such automatic back up in his article "Real time DASD Data Copy For Disaster Recovery", ENTERPRISE SYSTEMS JOURNAL, November, 1993, pages 92–100. An important aspect of such back up is maintaining so-called "sequence consistency" for ensuring so-called update sequence integrity. Such integrity is vital to maintaining congruence between the operating data copy in primary system 1 and the dual or recovery copy in secondary system 2. Such sequence consistency is maintained by establishing "consistency groups", as will become apparent. Such disaster back up can be based upon any grouping of data (i.e. any addressable entity), such as host processors 12 (system 1) defined logical volumes. Also, primary system 1 can act as a back up secondary system for secondary system 2.

Figure 3:
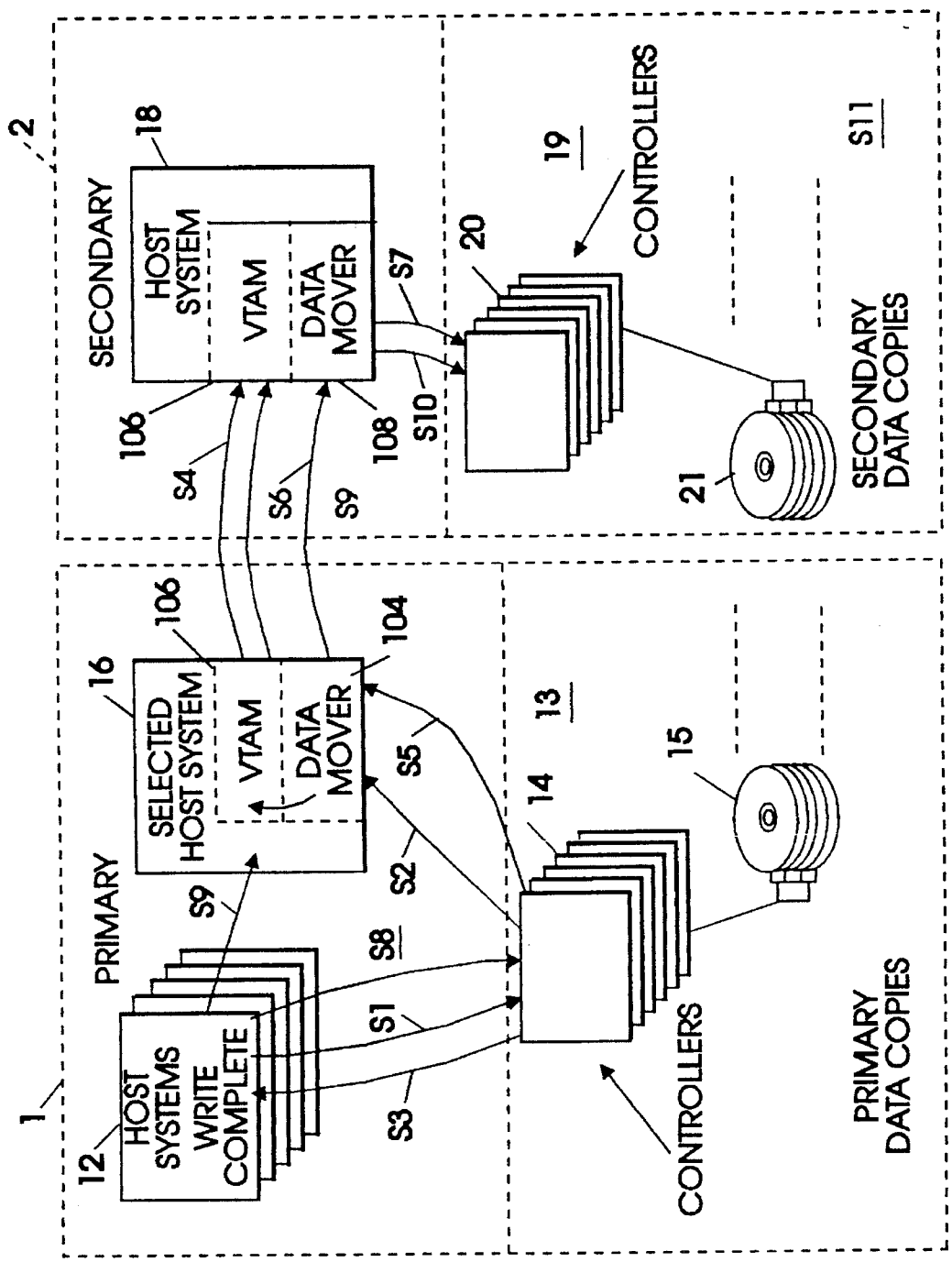
FIG. 3 is a diagram similar to FIG. 2 that includes a data flow diagram showing a sequence of machine-effected steps for remote copying updated data to a secondary system and a delayed update of a secondary directory some time after copies of updated data area stored in the secondary data-storage system FIGS. 4 and 5 diagrammatically show exemplary control formats of messages used to implement the remote copying shown in FIG. 1.

Referring again to FIG. 1, initially, in step 7, primary system 1 uses a known time of day clock to create a current time for setting time stamps to be used as later described. Such time stamps may be maintained in a host system and sent with each input-output (IO) operation. In another time stamp control, the time for time stamps is initialized in primary data-storage system 13 by a host system such that primary data-storage system 13 maintains a time stamp value synchronized with the host system time stamp clock (not shown). Then primary system 1 creates a remote copy session over system inter-connection 3 with secondary system. This remote copy session includes controls in both systems 1 and 2 for automatically effecting remote dual copying as best seen in FIGS. 2 and 3. Each remote copy session includes one or more (usually more than one) update write sessions. Each update write session transfers data from primary system 1 to secondary system 2 that constitute a consistency group of data in which the update sequence integrity of the primary 1 systems data is maintained in secondary system 2 stored data.

Primary system 1 then, in step 8, determines that an update write session is needed, i.e. data to be updated in primary system 1 are also to be remote dual copied to secondary system 2. In an early embodiment, each write update session is started and stopped based upon any one of a plurality of criteria. Such criteria includes, but is not limited to: 1) need to update data starts a pending write update session while completing data update terminates such pending write update session, 2) select time intervals during updating data, predetermined number of data processing operations have been executed in primary system 1, and the like. In step 8, primary system 1 (i.e. a host system 12 as seen in FIG. 2) sends a notice to primary data-storage system 13 to set up a pending write update session for a range of logical addresses, viz logical volume identification, logical track(s) identification, and the like. Primary data-storage system 13 assigns a pending write update session ID for the upcoming data updating with remote dual copying. Such pending write update session ID can be from a set of session ID's furnished to primary data-storage system 13 from a host system 12, for example. In step 9, primary data-storage system 13 supplies the pending write update session ID to the requesting host system 12 in primary system 1.

Alternately to steps 8, 9 and 10, system 1 may control pending write update sessions completely in a host system. In such an instance, each write command sent to primary data-storage system 13 includes an indication of whether or not the data to be written are data to be remote dual copied. If remote dual copying is indicated, then the sessions ID(s), logical address range and the like are included with at least a first write command setting up a pending write update session.

In either manner of establishing an update write session, the requesting host system 12 then establishes and controls the dual copying process. First, in step 10 (or as a replacement for steps 8, 9 and 10) the requesting host system 12 executes an ESTABLISH operation that sets up and initiates automatic remote dual copying of data in a logical address range identified in an ESTABLISH operation from primary system 1 to secondary system 2. A later-described PSF ESTABLISH peripheral command is sent to all appropriate later-described controllers 14 to establish write monitoring in primary system 1 for effecting the remote dual copying. The pending write update session ID is supplied to all receiving controllers 14. Substantially simultaneously, primary system 1 in step 11 sends an inter-system message to secondary system 2 informing secondary system 2 of the new pending write update session. Alternately, such information of remote dual copying can be inserted into each later-described transmission of data to system 2 as being a remote dual copy message having write tokens (later-described), updated data and necessary session ID's for such write tokens and updated data.

The asynchronous remote copying inter-system data transfers 4 are then effected. The dual copies of updated data may not be transferred in a sequence that duplicates the updating sequence in primary data-storage system 13. Such dual copy data are retentively stored in secondary data-storage system 19 as received without relating to the sequence of updating in primary system 1. Accordingly, for obtaining congruence between the systems 1 and 2 copies of data, it is necessary to determine the primary system 1 update sequence in secondary system 2. Indications of such updating are retained for later use in updating secondary directory 34 in a manner to reflect the primary system 1 updating sequence. Such directory 34 updating creates addressability only of that update data copy that is a most recent copy of each data unit to create congruence of the data copy in secondary system 2 with updated data in primary system 1, all without reading nor re-writing the copied data stored in secondary data-storage system 19. The unaddressable data may remain in secondary data-storage system 19 in an unaddressable state until removed, as later mentioned. The storage of dual copied data results in secondary data storage memorizing data storage locations in pending write directory 35. While primary directory 24 is updated as usual, the secondary directory 34 that provide addressability to data stored in the secondary data-storage system 19 is not updated at this time. Along with each dual data copy is a time stamp (time of updating indication) and indication of the subsystem used to write the data to primary data-storage system 13. These time stamps and sequence numbers are stored in pending write directory 35 along with identification of the dual copied data and the address at which such dual copied data are stored in secondary data-storage system 19. Such time stamps will be used later to select which data to make addressable in the second data-storage system 19. That is, updating secondary directory 34 is deferred until termination of a current pending update write session.

The primary system 1 time stamp indicating the time data were updated is a global time stamp that is the same for all subsystems. Further, such update data are identified by a primary system 1 sequence number. While the time stamps are indications of the respective times of data updating in primary data storage, sequence numbers are used to provide data integrity in the copying process. Any omitted sequence number in a series of sequence number indicates an omission of a data unit (byte, etc) copy being copied to the secondary data-storage system 19. Each later described subsystem has its own set of sequence numbers for ensuring that all data that the respective subsystem updates has been copied to the secondary data-storage system as well as indicating integrity of its own respective data writing operations. The consistency means (primary host) when terminating a pending write update session sends lists of sequence numbers assigned by the respective primary data storage subsystems to the secondary data-storage system. The secondary data-storage system compares such sequence numbers with the sequence numbers it has received. Any omission indicates that an incomplete set of data has been received at the secondary data-storage system. Remedial action beyond the present description is used to ensure congruence between the copy of data in the primary and secondary data-storage system.

Each sequence number is assigned by primary data-storage system 13 for identifying which storage subsystem 110, 111 (FIG. 9) (SS) effected the storage of each update data record or other data unit. Explaining further, primary system 1 creates a set of sequence numbers. While the sequence numbers may be assigned for an entire copy session that is broken into pending write update sessions, such sequence numbers could be assigned for each pending write update session(s). A subset of the created set of sequence numbers is given to respective ones of the subsystems within primary data-storage system 13. Comparing the sequence numbers and time stamps, the integrity of data copying and the actual sequence of data updating is determined in a known manner. Such determination of sequence of recording enables system 2 to replicate the system 1 updating sequence for ensuring congruence of the remotely stored copy of the updated data with the primary system copy of such updated data by preserving update sequence integrity.

Termination of a pending write update session is signalled by primary system 1 in step 17 by issuing a COMMIT operation command. At such termination of each write update session, the secondary directory 34 in the system 2 is updated as of a certain time indicated by a time stamp. Such updating takes into account the time and sequence of data updating in the monitoring writes in system 1 for ensuring congruence of the system 2 copy with the system 1 copy. Such updating in system 2 is achieved by establishing and removing addressability of data, as will become apparent. Such termination may be effected by a primary host 12 determining that no additional data will be updated, that a predetermined amount of data have been updated, upon expiration of a timing period, upon effecting a predetermined number of write operations, and the like.

In a second embodiment, one write update session is set up. Then, between a series of successive sequence check points within the remote copy session, the secondary system 2 storage directory is updated as of respective certain time stamps. The interval between two successive sequence check points, as will become apparent, effect a delayed updating of later-described secondary directory for limiting the number of DASD accesses in each update session to one. The data updated between successive check points in the second embodiment, or during a write update session in the first embodiment, are termed consistency groups. Each consistency group has all update data in system 2 identified as to sequence of updating in system 1. At the end of each pending write update session, the indications are evaluated and addressability of last updated data is established in secondary storage 19 while the addressability of all data (original data and intervening update data) is not established.

This description is directed to the first embodiment referred to above. Primary system 1 in step 17 indicates termination of a current pending write update session in step 5 sends a COMMIT inter-system message over system inter-connection 3 to secondary system 2. This COMMIT message indicates to secondary system 2 that addressability of all the updated and dual copied data within a given ESTABLISHED range of logical addresses is to be COMMITTED for storage in secondary system 2. No action need be taken in primary data-storage system 13. Such addressability updating in system 2 affects all dual copied data in one consistency group. That is, all data transferred to system 2 in the terminated pending write update session constitutes a consistency group. Termination of the pending write update session results in updating the secondary directories 34. The content of pending write directory 35 in secondary data-storage system 19 relating to the just-terminated pending update write session may be erased.

A preferred hardware configuration for practicing the present invention is shown in FIG. 2. Primary system 1 includes host processors 12 and 16 that manage the remote dual copying processes. Data are stored in peripheral data-storage system 13 that can be a typical multi-path plural-device data-storage system, hereinafter termed the primary data-storage system 13. Primary data-storage system 13 can be any known data storage arrangement, including but not required to be a later-described log structured array (LSA). On the other hand, if primary system 1 primary data-storage system 13 is also acting as a secondary system to another data processing system, then it is preferred that primary system 1 use such an LSA or reasonable equivalent. Primary directory 24 (FIG. 1) provides addressability of the data stored in data-storage system 13.

In accordance with an aspect of the present invention, for that data to be remote dual copied to secondary system 2, for monitoring the storage and to then copy all update data to secondary system 2 for storage in secondary data-storage system 19 as a recovery copy. For achieving such data storage monitoring in primary data-storage system 13, hosts 12 supplies a PSF ESTABLISH Perform Subsystem Function (PSF) command (FIG. 10) to those peripheral controllers 14 having a subsystem access facility to DASD's 15 storing data in the ESTABLISHED range of logical addresses. Which DASD's 15 are involved in such storage monitoring for each pending write session is determined by the logical address of the data to be dual copied, as will become apparent.

Secondary system 2 has secondary data-storage system 19 preferably arranged as an LSA or similar data storage arrangement, no limitation thereto intended. Secondary directory 34 provides addressability to data stored in secondary data-storage system 19 while pending write directory 35 stores address information for updated data retentively stored in secondary data-storage system 19 but not yet addressable through secondary directory 34. There may be either one pending write directory 35 for each pending write update session or one pending write update directory for all write update sessions. In the later, the sequence numbers or the pending write update session ID's may be used to identify the respective pending write update sessions.

System inter-connection 3 (a communication system, for example) couples primary system 1 to remote or secondary system 2 via host system(s) 18. For the purpose of practicing this invention in a best mode, host system 16 is designated the "selected primary host system". Host system 16 effects the actual data transfers for system 1 during each pending write update session. The selected primary system 16 includes a known operating system (OS) (not separately shown). In turn, the known OS includes a known data serializer and mover (DSM) 104 and a known Virtual Telecommunications Access Method (VTAM) 106 or the like for effecting communications between the primary and secondary systems 1 and 2 via system inter-connection 3. A system inter-communication system includes inter-connection 3 plus VTAM 106, DSM 104 and data mover 108.

Included in this invention is dual copying within a data center between a primary data-storage system 13 and a secondary data-storage system 19, both systems 13 and 19 being in the data center. The primary and secondary data-storage system 13 and 19 are independent, use different subsystems, attach to the same or different host processors and may be physically displaced from each other.

The known serializer portion of DSM 104 assigns a write sequence token to every reported data-storage system 13 write operation with the ESTABLISHED range. The term "reported" means that a subsystem, embodied in each of the controllers 14, has sent a request to DSM 104 that updated and recorded data is to be remotely dual copied. Such reporting includes an assigned time stamp of writing and a sequence number. DSM 104 inserts such time stamp and sequence number in a message being built. DSM 104, then in a known manner, puts these write sequence tokens into inter-system messages for VTAM 106 to send to secondary system 2 (secondary VTAM 106 and secondary data mover 108 receive the interprocessor message and forwards the received message to programs in host system 18 for processing, as will become apparent). DSM 104 tracks the requests by generating a table of requests, sequence numbers and time stamps as shown in FIG. 8 (later described). Also, the data mover portion of DSM 104 obtains changed (updated) data-records written to primary data-storage system 13. DSM 104 then combines such updated written records and their respective write sequence tokens into inter-system messages sent over system inter-connection 3 to VTAM 106 in secondary system 2. DSM 104 can be considered to be an extension of primary data-storage system 13. Host system 18 then, using data mover 108, records the received data records in secondary data-storage system 19, logs the write sequence tokens in a journal (not shown) and updates the FIG. 1 illustrated pending write directory 35.

VTAM 106 in both of said primary and secondary systems 1 and 2 are the respective host processor portions of known IBM Systems Network Architecture (SNA) produced and sold communications systems and apparatus. Such architecture is described in the article "An Introduction to Network Architecture's and Protocols" by P. E. Green, IBM System Journal, Vol. 18, No. 2, 1979. For additional details of VTAM operation and implementation reference also may be made to Harris et al, U.S. Pat. No. 4,914,619, "Apparatus and Method for Interconnecting an Application of a Transparent Services Access Facility to Remote Source", issued Apr. 3, 1990, and Astride et al, U.S. Pat. No. 4,855,905, "Multiprotocol I/O Communications Controller Unit Including Emulated I/O Controllers and Tables Translation of Common Commands and Device Addresses", issued Aug. 8, 1989.

VTAM's 106 transfer the inter-system messages over the known channel-to-channel (CTC) or ESCON portions of system inter-connection 3. The inter-system messages communicate from primary system 1 to secondary system 2 the establishment of shadowed (duplexed) data extents, write tokens that indicate updates in progress, and write tokens with changed data to be applied to the secondary data copies. System inter-connection 3 is operative on high bandwidth communication networks of one or more CTC connections coupling the primary and secondary systems. T1 lines, T3 lines, or other telecommunications services may be employed to support distances greater than ESCON or other direct CTC connections can support.

Secondary data mover 108 receives the inter-system messages sent by the primary system 1 via VTAMs 106, extracts and maintains the write sequence tokens, and records the received primary system 1 updated data in secondary data-storage system 19. Data mover 108 can be considered to be an extension of secondary data-storage system 19. It is parenthetically noted that primary and secondary systems 1 and 3 may be in a same physical location not requiring a VTAM data communication link. That is, the physical spacing between primary and secondary systems 1 and 2, as well the type of data-linking between them, is not limitative to practicing the present invention.

Figure 11:
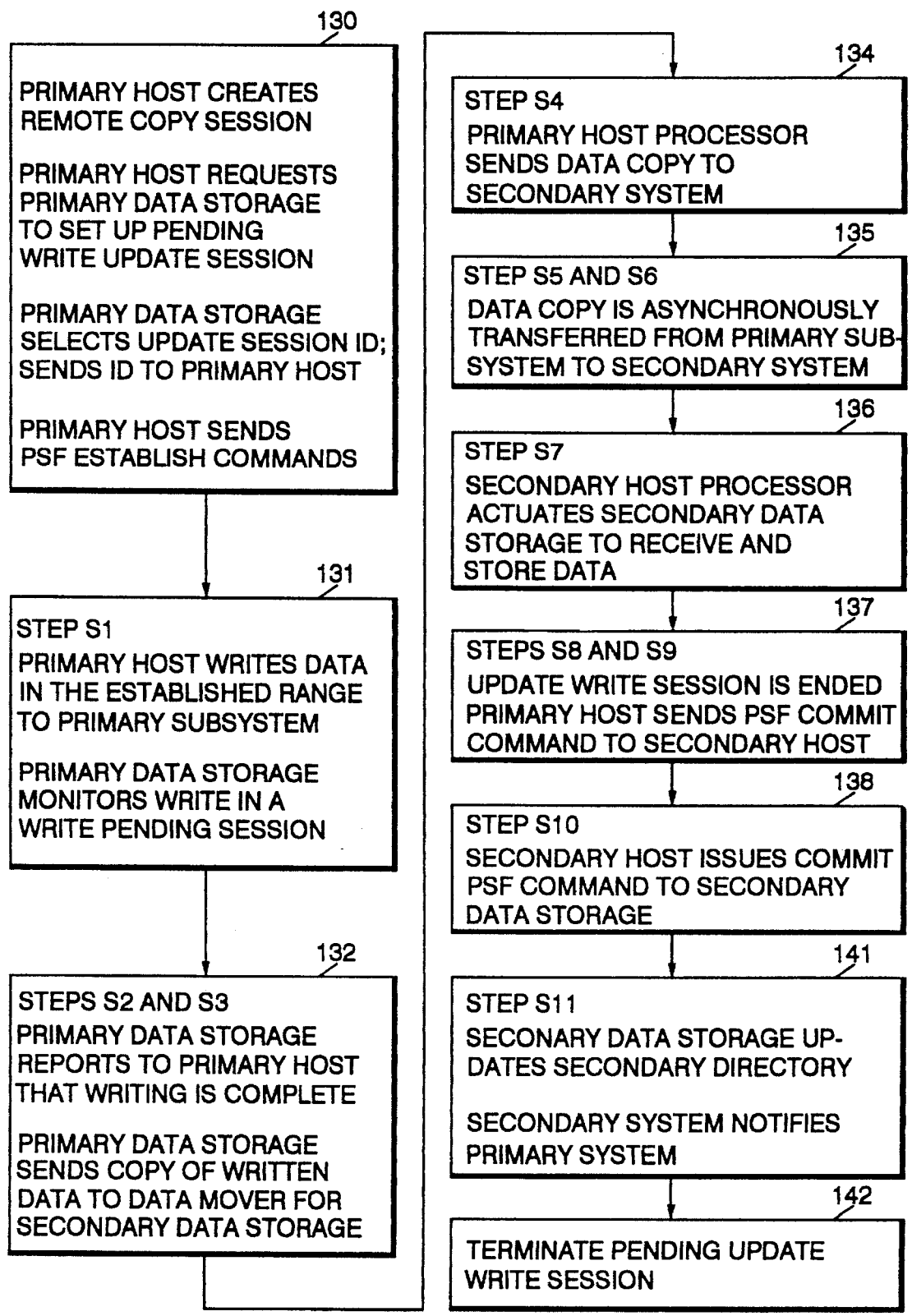
FIG. 11 is a detailed operation flow chart showing the FIG. 3 illustrated data and directory updating flow operations.

A general sequence of remote dual copying in accordance with the present invention is shown in FIG. 3. The encircled numbers S1–S11 indicate the steps for such remote dual copying with delayed directory updating. FIG. 11 illustrates this process in a greater detail. The operations described for FIG. 3 assume that a later described remote copy session has been created and that the previously referred to ESTABLISH function has been completed in both primary and secondary systems 1 and 2.

(S1). Data within the ESTABLISHED range is sent by one of the hosts systems 12, 16 to primary data-storage system 13. Primary data-storage system 13 by any one of controllers 14 effects steps (S2) and (S3). Note that any of the host systems 12, 16 and any of the controllers 14 having known subsystem connections to DASD 15 can effect steps (S1) etc. for any ESTABLISHED logical address range.

(S2) A primary data-storage system 13 controller 14 having one for the subsystems being monitored for dual copy sends a request to DSM 104 to remotely copy updated data to system 2. DSM 104 generates a write sequence token irrespective of which host system 12, 16 effected updating data in the ESTABLISHED range. Step (S2) can be executed after step (S3) or both tokens and data may be simultaneously transmitted to secondary system 2.

(S3) Primary controller 14 that reported a write operation to DSM 104 (including time stamp and sequence number), updates the data in primary data-storage system 13. Such updating in primary data-storage system 13 may precede any activity related to sending a copy update data to secondary system 2. In the described asynchronous dual copy session, controller 14 sends a write completed report to the host system 12, 16 that commanded recording the data. The particular sequence of sending data, tokens and updating primary data-storage system 13 can be selected as a design choice.

It is also parenthetically noted that each primary controller 14 can create a write token, however this description assumes that DSM 104 creates the pending write token.

(S4) DSM 104 builds an inter-system message (FIG. 5) for sending updated data records and their associated time stamps showing time of updating and sequence numbers in write sequence tokens to secondary system 2.

(S5) DSM 104, then reads the updated data from primary data-storage system 13 for transmission to secondary system 2 to complete the inter-system message.

(S6) DSM 104 then transmits the just created inter-system message (write sequence token(s) and associated data read from primary data-storage system 13) over system inter-connection 3 to secondary system 2. Such inter-system message may be one actual message having tokens and associated data, just tokens or just data.

(S7) Secondary data mover 108 receives and records the received data in secondary data-storage system 19, logs the associated received write sequence tokens in a suitable memory (can be on a DASD 21) for later use in the delayed update of secondary directory 34 (FIG. 1) updating for establishing addressability of the recorded data via secondary directory 34.

(S8) A host system 12 determines that a consistency data group is complete such that the current update write session may be terminated. Such termination requires that secondary data-storage system updates secondary directory 34. The primary host then generates a COMMIT command and inter-system message to be sent to secondary system 2.

(S9) Host system 16 sends a COMMIT inter-system message to secondary system 2. The COMMIT issuing host system 12 creates a time stamp for the COMMIT function.

(S10) Secondary selected host system 18 responds to the COMMIT inter-system message to actuate secondary system 2 second data-storage system 19 to send a COMMIT command to second data-storage system 19.

(S11) Secondary data-storage system 19 updates secondary directory 34. The pending write directory 35 can be erased if no further updating is to occur or can be left for enabling access to all of the update data whether or not made addressable by updating secondary directory 34.

In steps S1–S11, at primary system 1, data records can be momentarily stored in a NVCACHE, retentively recorded in DASD 15, separately compressed, compressed in units of logical tracks or other forms of files, and the like. Similarly, each data records can be separately stored in certain sized groups of data records or be limited to storing as one contiguous logical track.

Secondary system 2 preferably writes copied data to DASD upon receipt of all dual copied data to its DASD 21. At the termination of each update write session, the secondary directory is updated by secondary data-storage system 19 to reflect all dual copied data updated to the end of the write update session as updated in the same sequence as was performed in primary system 1. This action provides update integrity in secondary system 2 of the updated data for ensuring congruence of the remote data copy in the secondary system 2 to the primary copy in primary system 1. When the later-described LSA arrangement, or a similar arrangement, is used, addressability of data within the range that is outdated is "erased" by removing addressability of such data and establishing addressability to the latest update of data in the respective primary and secondary system directories for DASD 15 and 21. Such addressability changes avoids reading and rewriting the updated data—avoids additional DASD accesses.

Figure 4:
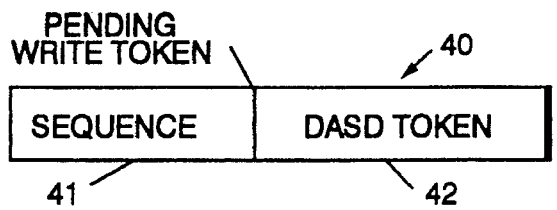
Figure 5:
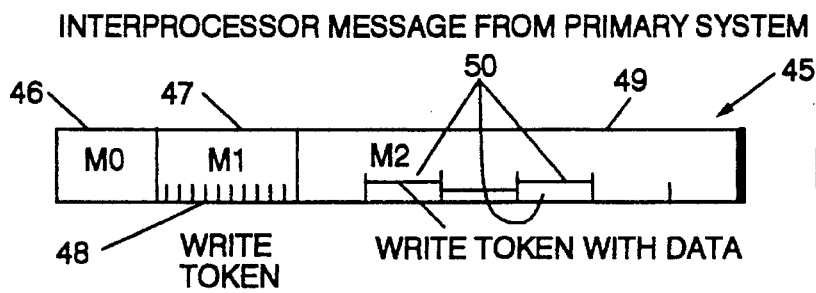

FIG. 4 illustrates a pending write sequence token used in the illustrated embodiment. Pending write token 40, created by DSM 104, has sequence number field 41 and DASD token field 42. Sequence number field 41 contains the primary system 1 global (unique number) assigned to the pending write session (later described) sequence number that identifies the update data. The ESTABLISH command-issuing host system 12 of primary system 1 assigns a set of unique sequence numbers for each subsystem (controller 14) to DASD 15. Such sequence numbers identify how the update data reached DASD 15. DASD token 42 identifies the update data (record number, logical track number and logical volume), pending write session ID (later described) and the time stamp indicating when a controller 14 received the write command. The sequence number plus the time stamp, as will become apparent, uniquely indicate the updating sequence of data in a multi-pathed primary data-storage system 13. This pending write token is logged in selected host system 16 and included in the FIG. 5 illustrated inter-system message format used to transmit update data within the ESTABLISHED range to secondary system 2. Such token may be sent from primary system 1 to primary system 2 before the data copy is sent or preferably with the data copy, such as in the FIG. 5 illustrated interprocessor message format.

Once remote data copying (pending write) sessions have been established, primary system 1 asynchronously sends secondary system 2 a series of inter-system messages (shown in FIG. 5) containing data being remote copied. Each of these inter-system messages, built by the DSM 104 and interpreted by secondary data mover 108, contains three message segments. The three segments of each inter-system update-data-carrying message 45 are referred to as M0 46, M1 47 and M2 49, respectively. M0 segment 46 is a data-mover-to-data-mover header that maintains logical continuity of the inter-system message stream and identifies contents of each inter-system message. Such identified message content may include information packet-data transmission (M1–M2), establish or terminate an update-pending write session, ESTABLISH a secondary portion of each update pending write session, communicate logical acknowledge signals from secondary system 2 to primary system 1, and for exception notification and recovery actions.

M1 segment 47 contains a set of pending write tokens 40 respectively in token slots 48. This set of pending write tokens are those pending write tokens created by DSM 104 since the immediately preceding inter-system message that sent data to be dual copied in the ESTABLISHED range identified in M0 segment 46. This set of pending write tokens represent data from primary system write operations in progress for which data have not been previously remote copied to secondary system 2.

M2 segment 49 contains a set of fields 50. Each field 50 contains a so-called information packet (groups of data records) plus the write (update)data associated with that information packet. Each information packet contains a copy of predetermined data in the ESTABLISHED range that is being transmitted for remote dual copying. The length of message 45 and the frequency of message transmissions are design considerations that trade off inter-system transmission efficiency with the time delay in notifying secondary system 2 of primary system 1 pending write operations in progress. Efficiency is enhanced by batching pending information packets and data into fewer but longer inter-system messages 45, i.e. amortizing transmission overhead over a larger number of M1 and M2 message elements in each message 45. Shorter, more frequently sent messages incur a greater total transmission overhead but keep secondary system 2 remote data copying in better synchronism with primary system 1 data recording. Such determinations are empirical and not further discussed herein. Each data record or groups of records less than a logical track may be separately compressed. In this latter arrangement, the contents of a logical track may be stored within an LSA in different physical locations and at different times. When the content of one logical track is always read from a DASD 15 to a cache, then compressing an entire logical track may be more efficient.

Figure 6:
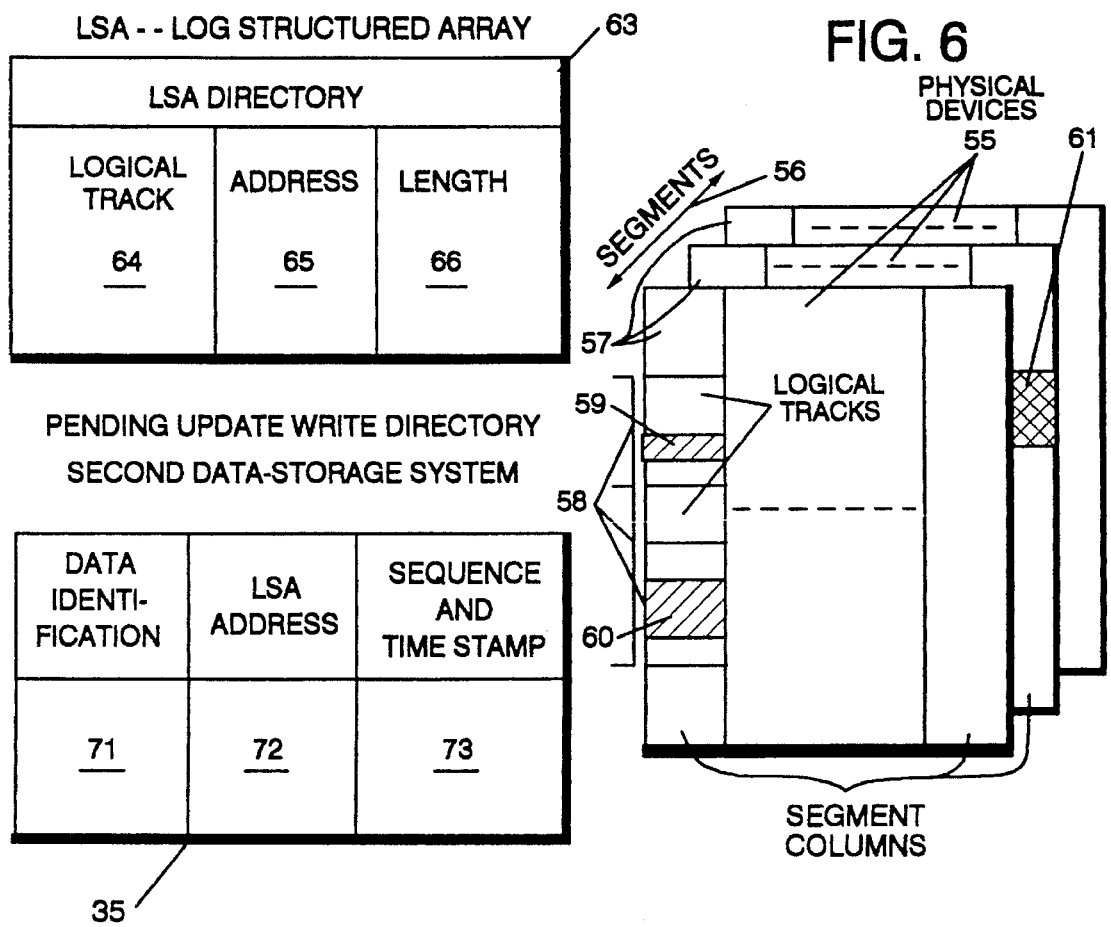
FIG. 6 is a schematic diagram of a log structured array (LSA) used for data storage in the systems shown in FIGS. 1–3.

FIG. 6 diagrammatically illustrates an LSA arrangement preferred to be used in practicing the present invention. The term "data unit" is used herein to denote a given byte of a given record in a given file. Other sizes of data units can be used. Data that are in a given data unit are one copy of the data unit. As each data unit is updated, the data of a data unit are replaced. Such replacement is characterized as first and second copies of the data unit. In this specification, all copies of updated data units are copied to the secondary system. Then the secondary system selects a most recent copy (the last or valid copy) of each updated data unit. The description of LSA keeps this definition in mind.

Before describing the details of an LSA, a general overview is provided. Data are stored in DASD either uncompressed or in a lossless compressed form. Lossless compression ensures against unintended data losses. Such data compression means that the amount of compression is data pattern dependent. In an LSA, after certain data (one or more records, for example) are updated, the resultant compressed data may have a greater extent or length than the data records to be updated. That is, the compressed updated data cannot be stored in the same data storage space as the original or data being updated. Accordingly, the prior art method of maintaining addressability at fixed or static data storage location does not apply to an LSA employing compression. Data (coded or uncoded image data) can be stored either as fixed block (constant length units) or variable length units. As such, secondary storage 19 keeps secondary directory 34 for addressing only a latest version of data even though earlier data are still stored in secondary data-storage system 19. Since primary system 1 and secondary system 2 may have significantly different data storage arrangements, directories 24 and 34 each have directory data that are not related to the other.

Host systems in either primary system 1 or secondary system 2 write logical records to the respective data-storage system 13 and 19 (if updates are at a byte level, then individual bytes may be stored in secondary system 2). Updating records received in the respective data-storage system can be momentarily stored in volatile cache 112 or retentively stored in NVCACHE 113 (FIG. 9) awaiting compression and retentive storage in the respective DASD. In primary system 1, data is preferably stored in logical track units of logical volumes. This requirement is not important to secondary system 2 dual copy storage because accessing to such dual copied data is mainly for recovery or replacement. Accordingly fragmentation of logical volumes dual copied is not a day-to-day performance degradation. In secondary system 2, it is more important to reduce the number of DASD accesses during any dual copy session.

FIG. 6 illustrates an LSA that stores compressed variable-length logical records in addressable logical tracks. Such logical tracks may be stored as a unit or be stored as a plurality of track portions, i.e. in a fragmented manner. The smallest fragment is one data byte. For dual copied data, the logical tracks are stored fragmented with a minimum storage fragment being a data byte. As will become apparent, such storage fragmentation facilitates dual copying by reducing the number of DASD accesses in secondary system 2. Since accessing such dual copy data is for recovery, most time and system resources are spent storing the data. Therefore, reducing the number of DASD accesses for storing the dual copy data is the most efficient and further makes the operation of the secondary system more efficient.

The LSA has N+1 physical disk devices (DASD) 55. Each data storing disk surface in disk devices 55 are logically divided into a plurality of contiguously addressable areas termed LSA segment columns 57. Each LSA segment column 57 may consist of one cylinder of tracks. The totality of LSA segment columns 57 having like physical addresses in the respective physical devices 55 constitute a LSA segment, represented by double-headed arrow 56. One of the LSA segment columns 57 in each of the LSA segments 56 contains error detecting redundancy for all of the other LSA segment columns in the LSA segment. In a constructed embodiment the error detecting redundancy is parity, such as odd parity. The parity LSA segment column in the various LSA segments 56 are preferably on different ones of the physical devices 55. Data formatted in count-key-data (CKD) or fixed-block (FB) formats are stored. Each logical track of each logical device is stored as a set of compress files entirely within one of the LSA segment columns 57. Many logical tracks are storable in each of the LSA segment columns 57. The physical location of each logical track, or each of its storage fragments, within the LSA changes with each update.

LSA directory 63 represents the structure of primary and secondary directories 24 and 34. The columns 64–66 represent a multiplicity of entries in the LSA directory 63. LSA directory 63 has one entry for each logical track. In each entry, field 64 contains the logical track identification (logical address), including identification of each separately stored logical track fragment, i.e. byte, byte cluster, sector, etc. Field 65 contains the physical address at which the logical track, including identification of each separate track fragment, is in fact stored within LSA (physical device, LSA segment column number and offset within the LSA segment column) and length of the logical track and each track fragment in physical sectors(not shown) on the disk having the LSA segment column storing the logical track. Accessing a logical track requires first accessing the LSA directory 63, then accessing the physical sectors in the respective LSA segment column. The entire LSA directory 63 is stored in non-volatile random-access control memory NVRAM 116 in the controllers 14/20. Such storage eliminates DASD accessing to obtain directory information.

Similarly, pending write directory 35 of second data-storage system 19 identifies the update data stored in LSA array, the LSA address and the primary sequence number and time stamp(time of updating indication). Data identification field 71 stores the logical address of the updated data unit (byte, record, etc). Such data unit identification 71 identifies each byte of the update data by logical volume (host addressing) and location in such logical volume (track number and byte offset or rotational position). Address field 72 identifies the LSA address storing the update data copy. Such update directory 35 identified update data is not yet addressable using LSA directory 63 even though retentively stored in the LSA. Field 73 stores the primary system assigned time stamp(time of updating indication), session ID and sequence number for each update data byte copy. Pending write directory 35 can be a usual log of a host processor or be kept in the LSA. One separate log or journal can be provided for each separate pending write update session. In any event, each copy of update data must be identifiable as being a part of a given pending write update session.

Writing data into LSA preferably follows the below described procedure. Each write to LSA is a logical track 58 or a fragment into an addressed one of the LSA segment columns 57. Such addressed one LSA segment column is not the LSA segment column currently storing data of such addressed logical track or fragment. If a logical track, or any of its fragments, of a logical volume has no data, then no data storage space in LSA is allocated respectively for the track or fragment. If data stored in LSA are updated, then a second copy of the logical track is recorded and the addressability of the original data is removed. For example, areas 59 and 60 represent updated data. To record this updated data, the replaced data of the respective logical tracks 58, or their fragments are written to a new data storage location. Usual data storage space recovery techniques, colloquially termed garbage collectors, reclaim data storage space in LSA segments 56. While recording data in a LSA segment, the above-described parity LSA segment is not recorded. When all of the N LSA segment columns of a given LSA segment are full, then the parity LSA segment column N+1 is filled with parity or other error detecting redundancies. Of course, parity may be written earlier if desired for data stored within the given LSA segment. NVCACHE 113 storing updated logical track fragments enables deferring writing of such update data to DASD. Note that because of the compression of logical tracks, updated data are stored in LSA at a different physical address than the original data. Therefore, until LSA directory 63 is updated, that directory enables addressing only original data—none of the updated data are addressable by LSA directory 63.

Figure 7:
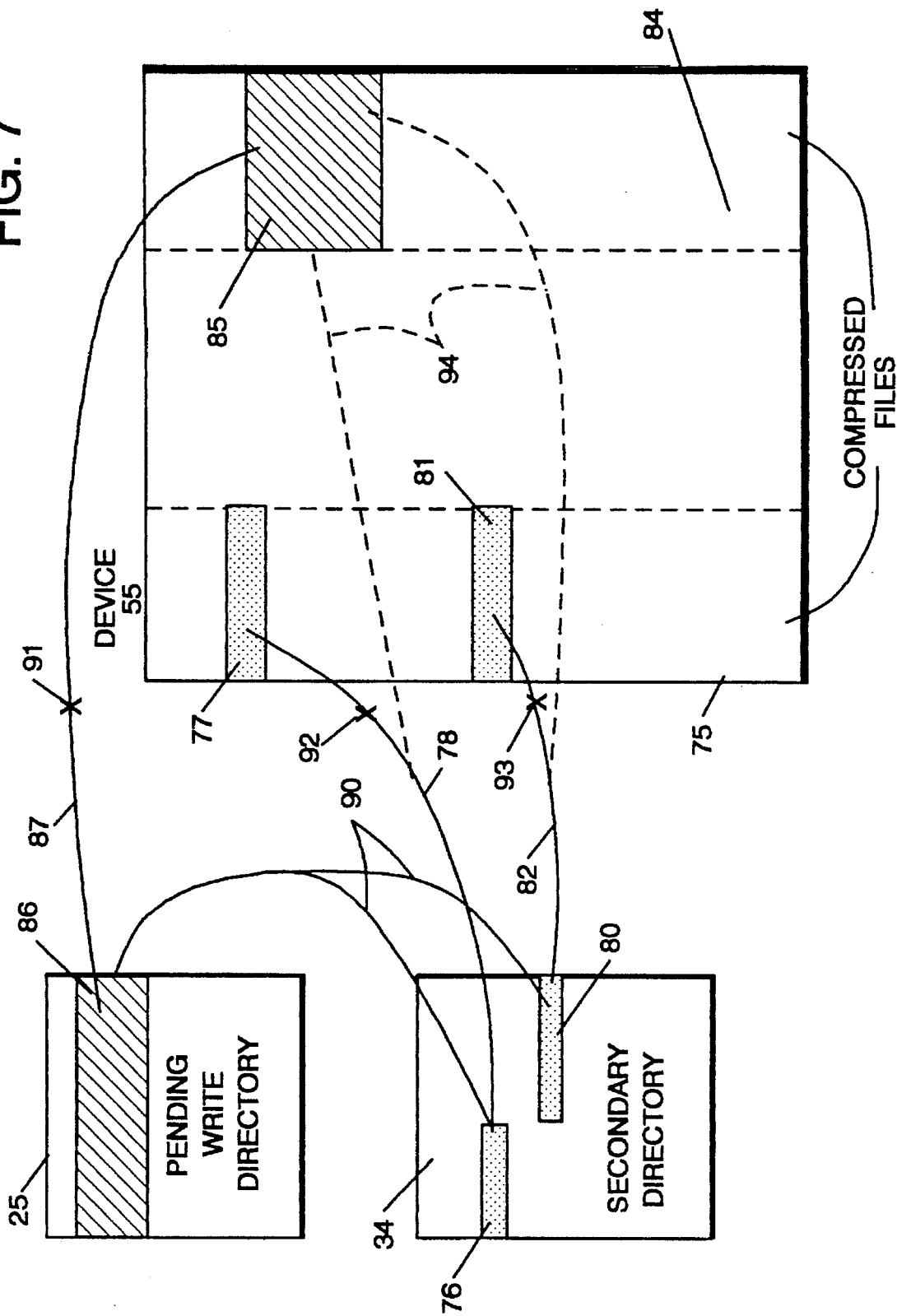
FIG. 7 illustrates a sequence of machine operations for updating data stored in an LSA shown in FIG. 6.

FIG. 7 illustrates updating secondary directory 34, an LSA directory 63, from a pending write directory 35. The description assumes that all data are identified by a primary host 7 as being in the same first logical volume but stored in two different logical tracks. It is assumed that the writing is to column LSA segments in one physical device. Directory 34 entry 76 points to original data of a logical track 77 of a first logical volume in a first column of an LSA segment of a first LSA segment 75 as indicated by line 78. Similarly, directory entry 80 points to a second original data of another logical track 81 of such first logical volume in LSA segment 75 as indicated by line 82. Logical tracks 77 and 81 may be recorded in different LSA segments. Entries 86 of pending write directory 35 point to updated data of logical tracks 77 and 81 stored contiguously in second LSA segment 84 at area 85. The update copies of data identified in update directory 25 as being in either one of logical tracks 77 and 81 may be stored in spaced apart data-storage locations (not shown) or in different LSA segments 56. In response to selected host system 16 issuing the above described COMMIT command and inter-system message, the controller updates secondary directory entries 76 and 80 using the data in pending write directory 25, all as indicated by lines 90. Entry 86 of pending write directory 25 is erased. The addressability effect of this directory updated is to make the original copy of the data in logical tracks 77 and 81 not addressable by primary directory 24 as indicted by the X's 92 and 93. Other original data stored in logical tracks 77 and 81 not affected by the updating remain addressable. Erasure of entry 86 from pending write directory 25 removes addressability of updated data in logical tracks at area 86 as indicated by X 91. Dashed lines 94 indicate that the updated logical track data are addressed by updated entries 76 and 80 in directory 24. The original data that is replaced by the update data at areas 77 and 81 remain in the LSA but are not addressable by secondary directory 25. Such non-addressable stored data are termed "garbage" and are to be removed later using known "garbage collection" methods.

The storage in DSM 104 of assigned subsystem sequence numbers for uniquely identifying updated data sources (subsystems in controller 14 (FIG. 9) and time stamps generated uniquely identify each record (or sets of records) and the sequence of recording in primary system 1 is explained with reference to FIG. 8. The term subsystem refers to each subsystem in a controller 14, for example. That is, each subsystem 110, 111 (FIG. 9) in controller 14 is assigned a unique set of sequence numbers for identifying which subsystem did the updating and the sequence of updating within that subsystem. Time stamps are global, therefore indicate relative time of updating irrespective of which subsystem performed the data updating.

The FIG. 8 chart is an example of a write update session spanning five subsystems (a subsystem in each of the primary controllers 14 is a subsystem SS) in primary system 1. These subsystems are identified in FIG. 8 as SS-A through SS-E. The columns headed by SS-A through SS-E contain the respective sequence numbers assigned by the controllers 14. The notations in the parentheses identify critical aspects of the updating sequence. A '>' in front of a sequence number identifies the highest time value (most recent time stamp) for the updated data recorded in data-storage system 13 via the respective SS. Each controller 14 has a time clock that is synchronized at power up, as is known. Subsystem D is "inactive"0 for this illustrated write update session. The term inactive merely means for the write update session, subsystem D may have been quite busy recording data in primary DASD 15 that is in another write update session or out of range for all current write update sessions. Sequence number 75 at time value 05300 was the last value generated by subsystem D identifying updated data form an earlier write update session.

Sequence number 124 represents a last updated data in SS-A. Sequence number 15 is the last updated data record of SS-B. SS-B updated has three more records or record sets not yet sent to DSM 104 for remote copying to system 2. Sequence number 382 was the last updated set of records updated through SS-C. SS-C sequence number 383 identifies updated data not yet sent to DSM 104 for remote copying in system 2.

At this point in time, examining the FIG. 8 chart (kept as a table in DSM 104) DSM 104 determines that the lowest time stamp value it has received from any one subsystem in the current write update session is 11006 with sequence number 15 from SS-B. DSM 104 recognizes that sequence number 401 from SS-E has a lower time stamp value than 11006, so sequence number 401 identified data will be included in the current write update session. Since sequence number 402 is later in time, the number 402 identified update data will not be included as a part of this update session.

Likewise, sequence numbers SS-A 121 and SS-C 380 and 381 will be included in the update session. Data identified by sequence numbers SS-A 122 through 124 and SS-C 382 have later time stamp values so will not be included as being a part of the current write update session.

Since DSM 104 has no time stamp values for SS-D; DSM 104 queries SS-D to receive last used sequence number 15 having time stamp 05300. This time stamp identifies updated data in a previous write update session. The COMMIT inter-system message is sent to system 2 including the sequence numbers and accomplished because each information packet is self-describing relative to other information packets in the same or different subsystems.

Figure 9:
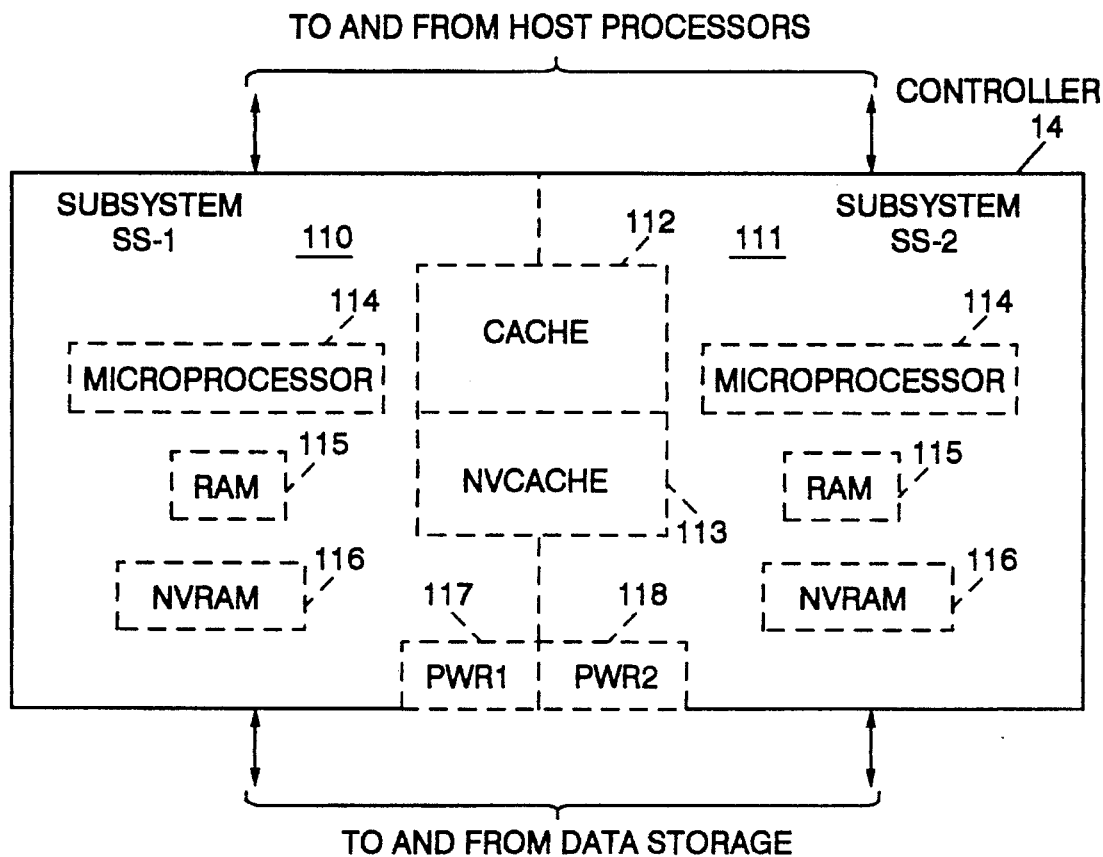
FIG. 9 is a simplified diagram of a LSA peripheral controller used in the FIG. 6 illustrated LSA.

FIG. 9 is a simplified showing of an LSA controller 14. Controllers 20 are identically constructed. Each controller 14 has at least two independent subsystems 110 and 111.

Each subsystem is identically constructed. Cache 112 is shared by the two subsystems. NVCACHE 113, also shared by both subsystems, is a non-volatile RAM (battery backup) for storing updated logical tracks. Each subsystem has a separate microprocessor 114 programmed in a usual manner. Each microprocessor 114 has its own random access memory (RAM) 115 and non-volatile RAM 116. Power supplies PWR1 117 and PWR2 118 respectively power subsystems 110 and 111. Controller 14 has the usual connections to host processors (via usual channels) and attachments to the DASD 15.

Figure 10:
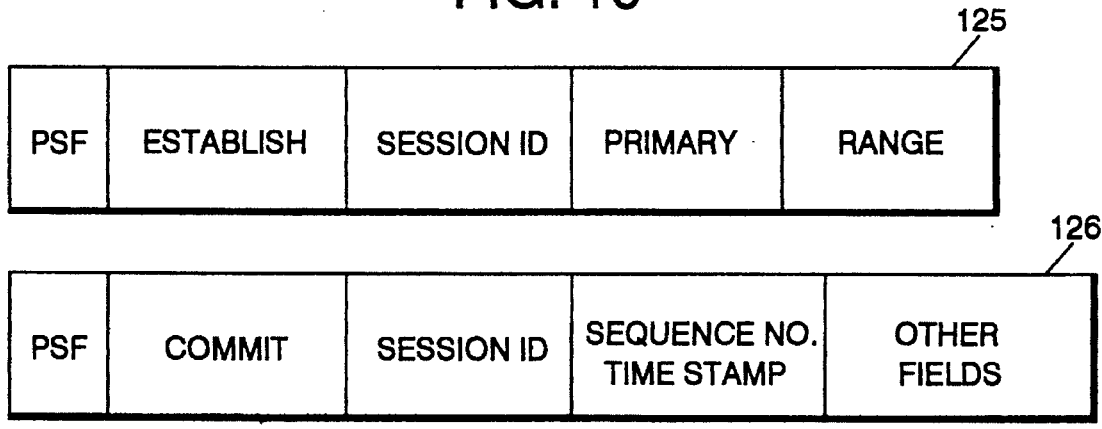
FIG. 10 diagrammatically illustrates two Perform Subsystem Function (PSF) host-issued peripheral commands used in the invention shown in FIG. 1.

FIG. 10 illustrates the PSF ESTABLISH and PSF COMMIT peripheral commands. The PSF ESTABLISH command 125 has PSF field signifying that it is a PSF type command. ESTABLISH field indicates the PSF command is a PSF ESTABLISH command. Session ID field identifies the session ID for the dual copy session. It is to be noted, that in the second embodiment such Session ID is used for all directory updates. In the first embodiment, DSM 104 assigns a separate write update Session ID each time data are copied from system 1 to system 2. This description assumes that this first embodiment is being used. Primary field identifies the controller(s) 14 (also termed subsystem) affected by the command. Range field indicates the logical address range to be used in a given pending write update session for effecting remote dual copy using the identified Session ID. Such range can be one logical track, logical volume or any other addressing range that may be desired.

The PSF COMMIT command 126 includes the PSF field, COMMIT field indicating that the command is a COMMIT command, session ID field and Sequence No. and Time Stamp field. The latter field stores limits of sequence numbers and time stamps identifying that any updated data therebetween is in a consistency group. The delayed updating of secondary directory 34 is effective as of the latest time stamp value in the COMMIT command.

Inter-system messages (not detailed) corresponding to each of the PSF ESTABLISH and PSF COMMIT commands are also created. These messages include the session ID, logical address range, sequence numbers and time stamps.

FIG. 11 is a flow chart of system operations in the first embodiment. Step 130 is the set-up or initializing step effected by an initiating host system 12. An initiating host system 12 is one that has automatically determined that remote dual data copying is needed for some of its data processing operations. First, the initiating host system 12 creates a remote copy session. Such remote copying sessions are known and not further described for that reason. Of course, rather than be a subset of a general remote copy session, an update write session may be an independent remote copy session.

Steps 131 through 136, corresponding to steps (S1) through (S7) of FIG. 3, are performed for effecting a series of remote dual copy data transfers from primary system 1 to secondary system 2. Steps 137 through 141, corresponding to steps (S8) through (S12) of FIG. 3 are executed at the end of each write update session (first embodiment) for making congruence between the remote data copies and the primary data copies and to update secondary directory 34 based upon a consistency group. Step 142 terminates the pending write update session. Subsequently ESTABLISHED pending write update sessions effect remote dual copying data from primary system 1 to secondary system 2.

In the first embodiment, in step 130, the initiating host system 12 requests primary data-storage system 13 to set up a pending write update session. Primary data-storage system 13 received a list of unique pending write update session ID numbers during the creation of the remote copy session from the initiating host system 12 for use as hereinafter described. Primary data-storage system 13 selects a next one of the unique pending write update session ID numbers and sends it to the initiating host system 12. Then the initiating host system 12 broadcasts the PSF ESTABLISH commands to subsystems in primary data-storage system 13 for providing access to the ESTABLISHED range of logical addresses as currently stored in DASD 15.

As an alternate to the above initiation of a pending write update session, an initiation host system 12 issues a series of write commands to the respective subsystems in controllers 14. Each write command, for remote dual copying, includes an indication that the write command is for data that is to be remote dual copied in a pending write update session having a specific pending update write session ID. In this instance, either the initiating host system 12 can assign sequence numbers and time stamps or the respective subsystems may assign sequence numbers and time stamps. In any event, either procedure is usable in practicing the present invention.

In step 131, primary host systems 12 write data to primary data-storage system 13 in an ESTABLISHED range. Such primary host system also internally logs such write in a usual manner that is not pertinent to the present description. The primary subsystem (controller 14) detects that the logical address is in the ESTABLISHED range, there monitors the write operation as a pending write operation using the established session ID. All writing in the ESTABLISHED range is monitored for effecting dual copying. The monitored write is reported to DSM 104, including a time stamp of the write. DSM 104 then assigns a sequence number to the write operation and builds a pending write token. This action in DSM 104 is preparatory to sending updated data, tokens and sequence numbers to secondary system 2 as a consistency group.

In step 132, DSM 104 actuates a subsystem of primary data storage system 13 to copy updated data to DSM 104 (data mover) for forwarding to secondary system 2. DSM 104 accumulates pending write tokens and updated data for the session ID to prepare an inter-system message to copy such information to system 2 in step 134.

Further in step 132, controller 14 (primary subsystem), in an asynchronous dual copy session, reports to the write command issuing host system 12 that the write is complete. The remote copying is then effected asynchronously to host system operations. Second data-storage system 19, upon retentively storing the dual copy of the data, reports to the first data-storage system 13, via the inter-system connection 3, that the dual copy has been stored. Then first data-storage system reports completion of the storage operation to the issuing host system 12.

In step 134, DSM 104 in host system 16 completes the inter-system message.

In steps (S5) and (S6) of step 135, the updated data with write pending tokens are transmitted over interconnection 3 to system 2 for storage in its secondary data-storage system 19. Then the receiving host builds a map (pending update directory 35) of sequence numbers and time stamps for the session ID (FIG. 8) preparatory to updating secondary directory 34.

In step 136 the host system writes the received dual copy of data to secondary data-storage system 19. Controller 20 detects that the write is a dual copy, therefore, stores the updated data in its NVCACHE 113, updates pending write directory 35 for addressability of the data and reports to the secondary host system that the data has been recorded.

In step 137, host system 12 issues a PSF COMMIT command to primary data-storage system 13 and sends a COMMIT inter-system message to secondary system 2 committing the data to DASD 21.

In step 138, secondary host system makes the series of updates to be consistent with the actual recording in primary system 1. The sequence numbers and time stamps are used in a known manner to sort the write operations for effecting the consistency of sequence within the consistency group. Then secondary host processor 18 issues a PSF COMMIT command to secondary data-storage system 19 to update secondary directory 34 in a manner to preserve the primary data-storage system 13 update sequence. The pending write directory 35 contents for the updated data in the just terminated update write session are erased. DSM 104 generates a new session ID for repeating steps 131–141.

Step 142 terminates the current pending write update session. The initiating host system 12 may terminate the current session when all data have been updated, at the expiration of a predetermined time interval, reaching predetermined check points in program execution, and the like. Upon termination, a new pending write update session is initiated in step 130. Then steps 131–136 are repeated for transferring data from primary system 1 to secondary system 2. Steps 137–141 are repeated once to effect the COMMIT function.

Figure 12:
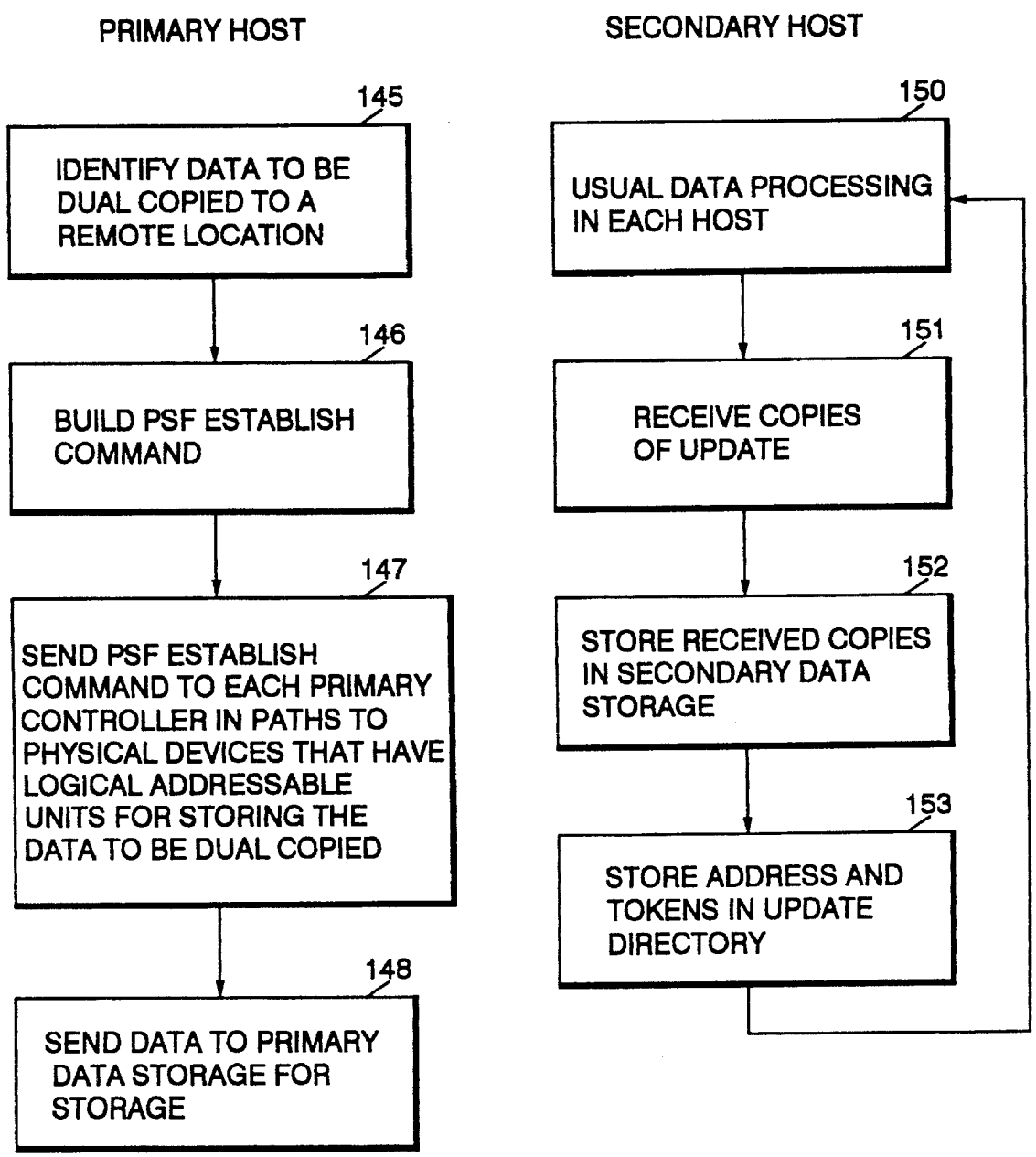
FIG. 12 is a detailed operation flow chart showing operations in a primary host relating to practicing the present invention in a preferred mode.

FIG. 12 is a simplified operation chart of host system operations relating to write update. For a primary system 1 host, step 145 identifies data to be copied to a remote location (set up 130 of FIG. 11). Step 146 builds a PSF ESTABLISH command for identifying a range of logical addresses in which dual copy is to be effected. Appropriate ESTABLISH information is sent to secondary system 2. Step 147 sends the PSF ESTABLISH command to the appropriate primary controllers 14. Step 148 represents the usual writing operations in primary system 1 as shown in FIG. 11 step 131.

Steps 150–153 show secondary host system for writing copied update data to secondary peripheral data-storage system 19. Step 150 represents usual data processing in a host system. Step 151 receives copies of update data from primary data-storage system 13 to be stored in DASD 19. Step 152 stores the received copies of data into secondary data-storage system 19. Step 153 stores the address at which the copies are stored, the received tokens and sequence numbers in pending write update directory 25. Then usual host operations resume in step 150 signifying completion of the storage of dual copied data received in one inter-processor message.

Figure 13:
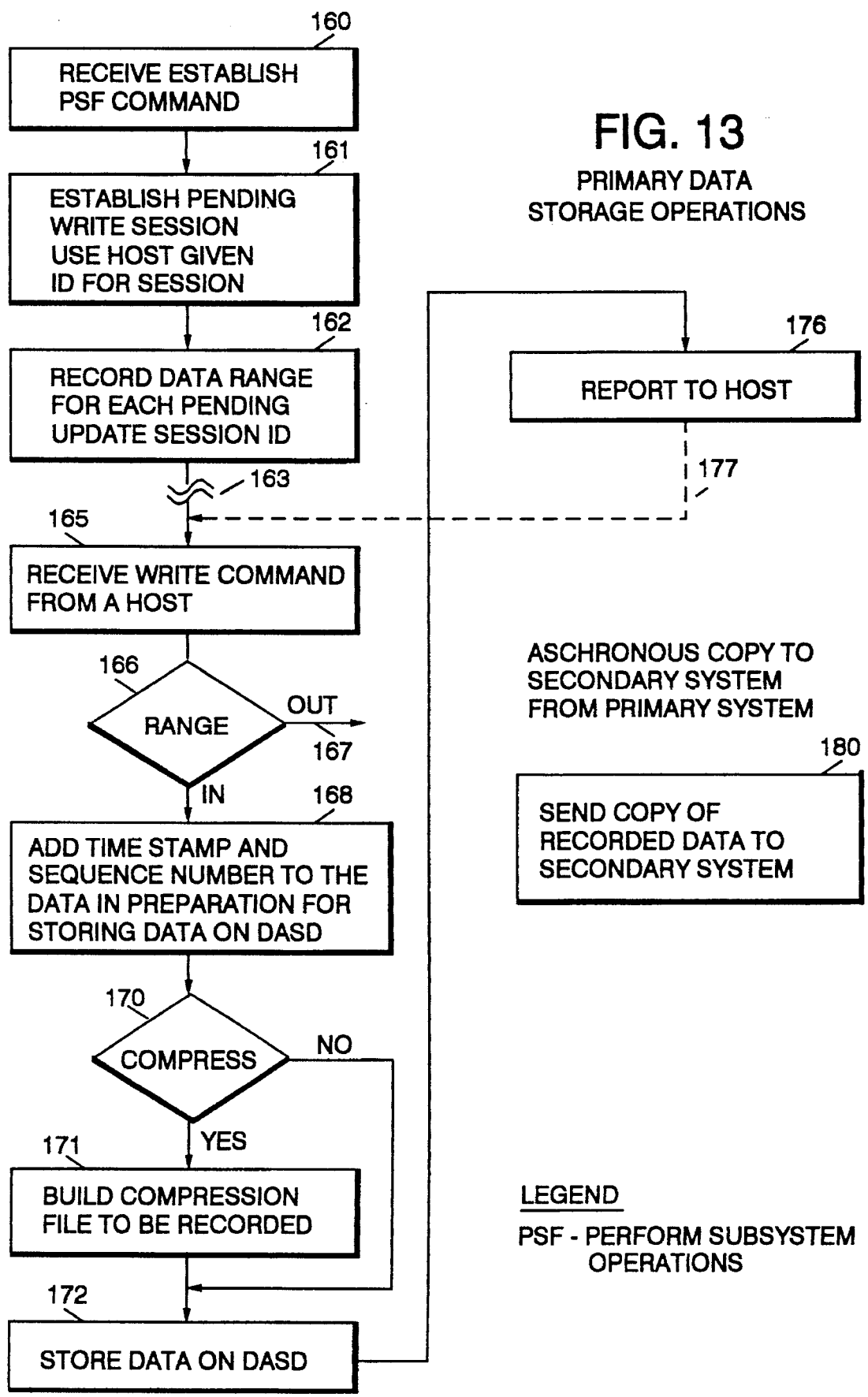
FIG. 13 is an operation flow chart showing operations in a primary system in a preferred implementation of the FIG. 1 illustrated invention.

FIG. 13 is a flow chart showing operations in primary data-storage system 13. Step 160 receives the PSF ESTABLISH command in the appropriate controller(s) 14. Step 161 establishes a pending write session using a session ID provided by host system 16. Step 162 records in NVRAM 116 the ESTABLISHED range of logical addresses, i.e. identifies the logical addressable entities that require remote dual copy. Step 163 indicates that other data storage operations are performed. Step 165 receives a write command from a primary host system. Step 166 examines the logical address for determining whether or not the logical address is in the ESTABLISHED range. If not, then at path 167 at the OUT exit of step 166 usual recording operations without remote dual copy are performed. From exit IN of step 166 remote dual copy is required. Step 168 adds a time stamp to the operation and reports it to DSM 104 which adds a sequence number. As an alternative, controller 14 may have a set of unique sequence numbers received from DSM 104 and may assign a number from its set to each write operation within the pending update write session. Step 170 determines whether data compression is being used. In the first embodiment, data compression is always used. Step 171 builds a compression file to be recorded that includes the updated data. Such compression file may include other data as well. Step 172 retentively stores the updated data in DASD 15. The primary directory 24 is updated as usual to reflect the updated data storage, while primary directory 24 is updated using the pending write update directory contents. Step 176 reports to the primary host system 16 that primary system update has been completed. Path 177 leads to a repeat of steps 165–176.

Asynchronous to all data processing in primary system 2, step 180, under supervision of DSM 104, sends a copy of update data to secondary system 2.

Figure 14:
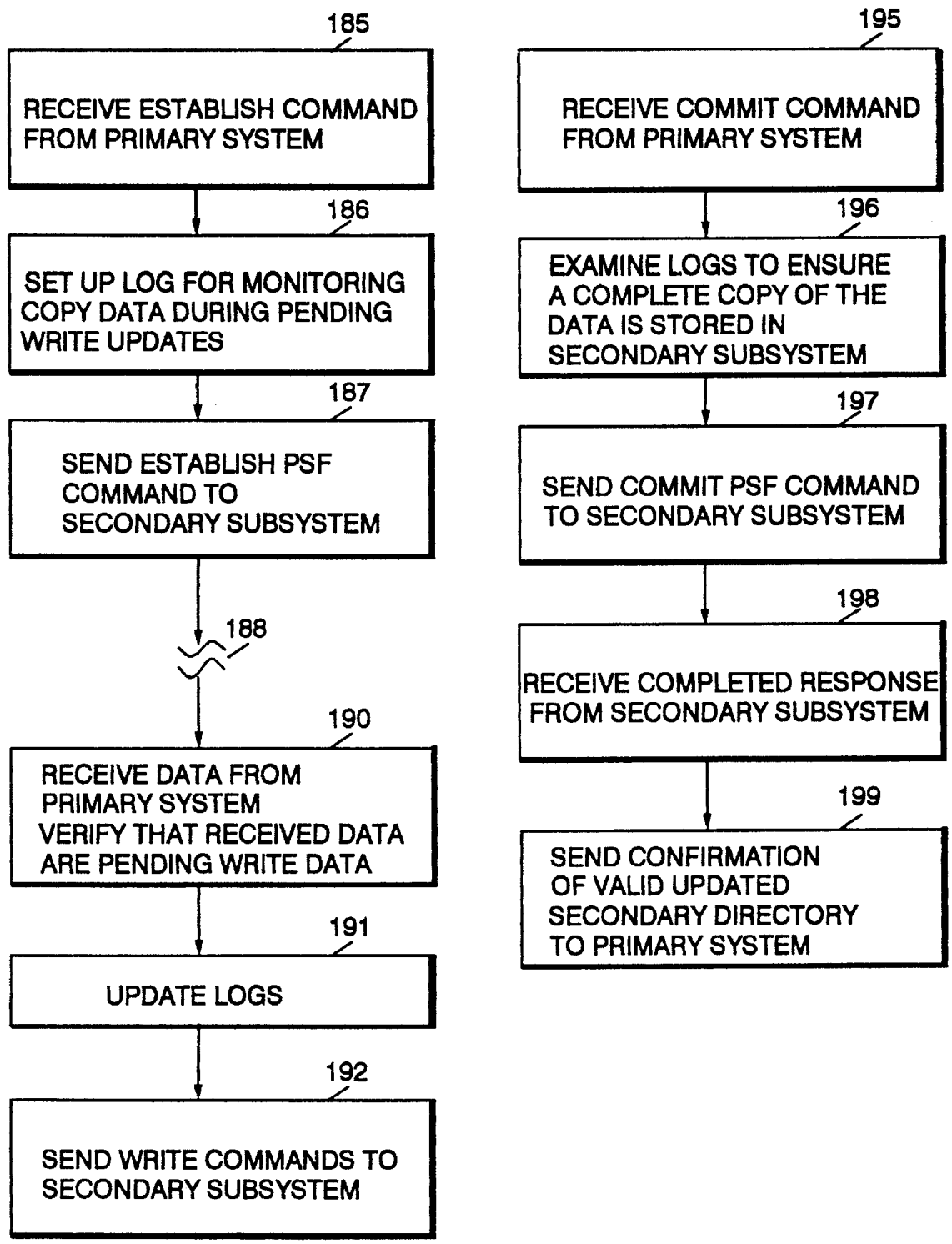
FIG. 14 is an operation flow chart showing secondary host operations used for remote data copying.

FIG. 14 is a flow chart showing operations of secondary system 2 host system operations. Step 185 receives the ESTABLISH inter-system message. Step 186 sets up a log, separate from the usual journal log, for handling within the secondary host system 18 the remote copying. Step 187 sends a PSF ESTABLISH command to secondary data-storage system 19 to monitor write operations for effecting remote dual copy.

Step 188 indicates other operations.

Step 190 receives update copy of data over inter-connection 3 from primary system 1. Responsive to the received inter-system message, step 191 updates its dual copy log of host system 18. All update data sent to secondary data-storage system 19 are retentively stored in DASD 21. For improving DASD 21 efficiency, NVCACHE 113 or cache 112 may store the copied update data until a suitable extent of data from any number of data sources is accumulated.

The COMMIT process is initiated in step 195 at the secondary system 2 by receipt of a COMMIT inter-system message from system 1. Step 196 examines the update logs to ensure a complete copy of the update data has been received. If not, then the missing data are requested and received. Then, in step 196, the write operations are sorted by time stamp to ensure congruence to the sequence of recording in primary system 1. Only identified write operations within a specified range of sequence numbers and time stamps are used in the update. Step 197 sends a PSF COMMIT command to secondary data-storage system 19 which responds as set forth in FIG. 15. Step 198 receives the completed update response from secondary data-storage system 19. Step 199 sends confirmation to system 1 that the update has been completed in secondary system 2.

Figure 15:
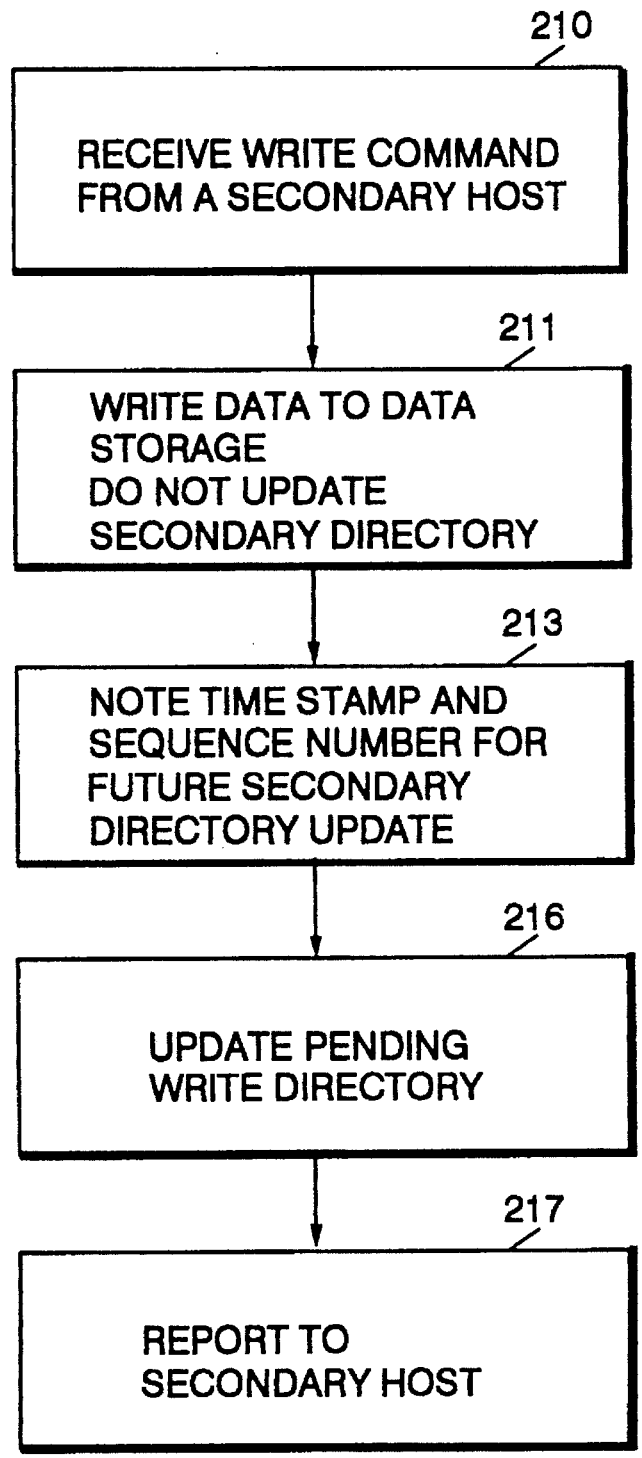
FIG. 15 is an operation flow chart showing secondary system operations during a data update in accordance with the present invention.

FIG. 15 is a simplified flow chart of secondary data-storage system 19 operations relating to the present invention. This description assumes that secondary data-storage system 19 has been properly set up for receiving copies of update data from primary system 1, such as set forth above. Step 210 receives a write command from secondary host system 18 for recording copies of update data received from system 1. Such write command may indicate the session ID, token, sequence number of the data to be written as backup copies of primary system copied data. It is to be understood that secondary system 2 may also store other data that is not backup data. Write commands for such other data do not include such session ID, etc. Step 211 writes the received copy of update data to secondary data-storage system 19 as dual copy data, i.e. does not update secondary directory 34.

Step 213 stores the time stamps (times of updating), sequence numbers and addresses of the data-storage locations the received copies are stored in pending write update directory 35. Step 216 updates pending write directory 35. Step 217 reports the writing to secondary host system 18.

The pending update directory 35 may be a journal of secondary host processor 18. In this instance, secondary host processor 18 performs all sorting and control of the directory 34 updating. Note that any secondary host journalling of this information is an equivalent of pending write update directory 35 shown as being in secondary data storage system 19 excepting it is controlled by a secondary host processor rather than secondary data-storage system 19. Using either approach is a matter of design choice.

In the embodiment in which secondary data-storage subsystem performs all of the updating, the response of secondary data-storage system 19 to a PSF COMMIT command depends on a current specific arrangement. First of all, all of the entries in pending write update directory 35 relating to the just-terminated pending write update session are fetched. Such fetching can be based upon a session ID, ranges of sequence numbers, ranges of time stamps (times of updating), all entries in a given pending write update directory and the like. Once the entries are selected, then secondary data-storage system 19 sorts the time stamps to establish data congruency may be done either in host 18 or in data-storage system 19, all as described above. Only the identified entries that indicate a most recent copy of data for each respective data unit is inserted into secondary directory 34. After such sorting, if the sorting is done in a host processor of secondary system 2 (such program sorting of this data is deemed to be a part of the secondary data-storage system) then in step 39 (FIG. 1) a copy of each entry in pending write directory(s) 35 is inserted into secondary directory 34 for making all of said most recent copies the current data in the respective data units, i.e. the congruent copy based on the sorting mentioned above. Then, secondary data-storage system 19 establishes addressability in secondary directory 34 as set forth with respect to FIG. 7.

While the invention has been particularly shown and described with reference to preferred embodiments thereof, it will be understood by those skilled in the art that various changes in form and details may be made therein without departing from the spirit and scope of the invention.

What is claimed is:

1. A dual mode remote data copy apparatus for transferring updated data from a primary data-storage system to a secondary data-storage system, including in combination:

a primary data processing system connected to said primary data-storage system;

said secondary data-storage system connected to said primary data-storage system and to said primary data processing system;

said primary and secondary data-storage systems having primary and secondary long-term storage comprising first and second peripheral means, respectively;

each said peripheral means in both said data-storage systems having a plurality of first and second device addressable data-storage locations for retentively storing data;

primary and secondary directories respectively in said primary and secondary data-storage systems for respectively providing addressability of data stored in said first and second peripheral means;

an update directory in said secondary data-storage system for providing addressability of update copy data stored in said second peripheral means;

pending write update means in said primary data processing system and being connected to said primary and secondary data-storage systems for establishing a pending write update session wherein during said pending write update session predetermined data contained in predetermined ones of addressable data units stored in said primary data-storage system are updated by one or more successive copies of said update data, each said copy of each said updated addressable data unit is copied to said secondary data-storage system and wherein said primary directory is updated to address each successive copy of said update data but said secondary directory is not updated until said pending write update session is terminated, then updated with a most recent copy of said update data for the respective addressable data units;

primary data update means in said primary data-storage system and connected to said pending write update means and to said primary data processing system for repeatedly receiving copies of said update data from said primary data processing system during said pending write update session and for responding to receiving said update data during said pending write update session for repeatedly storing said update data in said first peripheral means as successive copies of said addressable data units, respectively, that are updates to data of said addressable data units currently stored in said first peripheral means and updating said primary directory to address said update data, as copied data, stored in said primary data-storage system such that said primary directory has only addresses for a last recorded copy of data that are updated a plurality of times;

time means in said primary data update means for indicating a time of updating for each said data update; identifying data updated at each indicated time of updating for indicating which data are most recently updated copy of said update data;

system inter-communication means connected to said primary and secondary data-storage systems; to said pending write update means; said time indicating means and being responsive to said pending write update means establishing said pending write update session; and to said first update means updating data stored in said first peripheral means in a primary temporary data storage, as a part of said pending write update session, said update data stored in said primary data-storage system, to copy each respective said time of updating indication and said identification to said secondary data-storage system and for indicating to said secondary data-storage system that said copied update data, said time of updating indication and said identification of data are a part of said pending write update session;

secondary data update means in said secondary data-storage system connected to said update directory, to said primary temporary data storage and to said system inter-communication means for responding to receiving said update data, said time of storage indication and identification of said update data in said pending write update session for storing said update data in said second peripheral means and to update said update directory including storing said time of updating indication and identification of said update data in said update directory for indicating said received update data are a part of said predetermined data;

consistency means in said primary data processing system for indicating termination of said pending write update session and that said secondary directory is now to be updated for actuating secondary data-storage systems to update said secondary directory; and secondary directory update means being connected to said consistency means and having data selection means for selecting only that portion of said copied update data stored in said second means and having a time of updating indication that indicates which of said copied update data is a most recent copy of said copied update data and for updating said secondary directory to indicate addresses of only said most recent copy of said copied update data currently stored in said second peripheral means.

2. The apparatus set forth in claim 1, further including, in combination:

said first peripheral means having a plurality of addressable first data storage devices, each of said addressable first data storage devices having a plurality of said addressable data-storage locations;

time stamp means in said primary data processing system for generating a current time indication;

said time means being connected to said time stamp means for receiving said current time indication for making a copy of said received current time indication for each of said updates of said updated data stored in said primary data-storage system;

said system inter-communication means sending each said stored time of updating indication with the respective copied update data to said secondary data-storage system;

said update directory being connected to said system inter-communication means and to said secondary directory update means for receiving and storing each said copied time of updating indication and said identification of said copied update data received from said primary data-storage system at the time indicated in said received time of updating indication, respectively;

said secondary directory update means responding to said termination of said pending write update session to access said update directory to retrieve and sort the time of updating indications in order of time for selecting a most recent time of updating indication for each said identified data having plural copies in said second peripheral means each with a different time of updating indication for creating a set of said most recent copy of said copied updated data, then updating said secondary directory.

3. The apparatus set forth in claim 2, further including, in combination:

plural subsystem means in said primary data storage connected to said first peripheral means and to said primary data processing system and having a plurality of first subsystems for independently connecting all of said first addressable data storage devices to said primary data processing system such that said first data storage devices and said primary temporary data storage can access any one of said first subsystems;

first subsystem indicating means in said primary data update means having a predetermined set of sequence numbers for allocating and sending a subset of said sequence numbers to respective ones of said first subsystems;

said primary data update means being connected to said first subsystem indicating means for assigning one of said sequence numbers to each of said data updates, respectively, for indicating which of said first subsystems transferred said data updates to said first peripheral means;

said system inter-communication means adding each of said assigned sequence numbers to the respective said update data being copied to said secondary data-storage system; and said secondary directory update means further selecting said time of updating indications that are also identified by said sequence numbers, then sorting said time of updating indications for each identified data, then sorting the time of updating indications for selecting the most recent time of updating indication for each said identified data to select data that comprises said most recent copy, respectively.

4. The apparatus set forth in claim 3, further including, in combination:

said secondary data-storage system comprising a log structured array; and said log structured array having N addressable second data storage devices, N being a positive integer, each of said arrays being divided into a plurality of addressable data-storing segments, each of said plurality of segments consisting of a column segment in each of said second data storage devices, respectively, wherein addresses of said column segments in any of said N addressable second data storage devices having identical addresses within the respective N data storage devices.

5. The apparatus set forth in claim 4, further including, in combination:

said log structured array having data compression means for compressing all data stored in the respective addressable data storage devices; and said secondary directory update means updating said log structured array including writing updated data and all non-updated original data in a new addressable area of the respective log structured array, then updating said secondary directory to indicate only said new addressable data.

6. The apparatus set forth in claim 5, further including, in combination:

said consistency means being in said primary data processing system;

said consistency means having end means for indicating that all data updates to said primary data-storage system have been completed; and said consistency means responding to said end means for indicating said termination of said pending write update session.

7. The apparatus set forth in claim 5, further including, in combination:

said log structured array having storing means connected to said compression means for combining diverse compressed data into a compressed file for storage in said second device at predetermined ones of said second device addressable data-storage locations, respectively, and indicating said predetermined ones of said second device addressable data-storage locations; and said secondary data update means being connected to said storing means for receiving said indications of said addressable storage area storing said copied predetermined data for updating said update directory.

8. The apparatus set forth in claim 7, further including, in combination:

said secondary data-storage system including a non-volatile random access control memory; and said secondary directory being stored in said non-volatile random access control memory in said secondary data-storage system.

9. The apparatus as set forth in claim 7, further including, in combination:

a secondary data processing system located physically remote from said primary data processing system;

said secondary data-storage system being in said secondary data processing system;

first and second data communications means respectively in said primary and secondary data processing systems and being connected to said system inter-communication means for transferring said update data from said primary to said secondary data processing system;

said first and second data communications means being connected to said primary and secondary data-storage systems, respectively; and said primary data-storage system indicating to said primary data processing system that said update data are stored in said first device before said update data are copied to said second device.

10. The apparatus as set forth in claim 9, further including, in combination:

copy session means in said primary data processing system for establishing a data copy session between said primary and secondary data processing systems and being connected to said pending write update means for enabling said pending write update means to establish a sequence of said pending write update sessions within said data copy session; and said pending write update means having initialization means for establishing each said pending write update session for a predetermined number of update data transfers including generating said sequence numbers for each said pending write update session such that each pending write update session has a unique set of said sequence numbers.

11. A machine-effected method of backing up data stored in first peripheral means of a primary data-storage system of a primary data processing system into second peripheral means of a secondary data-storage system that is physically independent of said first peripheral means; each said peripheral means in both said data-storage systems having a plurality of first and second device addressable data-storage locations for retentively storing data; said secondary data-storage system further having primary and secondary temporary data storage having temporary addressable data storage; primary and secondary directories respectively providing address-ability of data stored in said first and second device; an update directory in said secondary data-storage system for providing addressability in said temporary data storage and to predetermined data stored in said second peripheral means independently of said secondary directory;

the machine-effected method including machine-executed steps of:

in said primary data processing system establishing a pending write update session in which data in the primary data-storage system are updated by update data that are to be copied from said primary data-storage system to said secondary data-storage system during said pending write update session;

repeatedly updating data in said primary data-storage system including for each said data updates in said primary data processing system, identifying said data updates as being in said established pending write update session including indicating time of updating of each data update;

after updating said primary directory to reflect each said data update for providing addressability to such update data;

sending a copy of each said data update during said pending write update session, including the respective indicated time of updating in said established pending write update session, to said secondary data-storage system;

in said secondary data-storage system responding to receiving said data update and its respective time of updating indication during said pending write update session for storing said data update in said second device and storing said time of updating and an identification of said stored data only in said update directory as respective update directory entries;

in said primary data processing system, indicating to said secondary data-storage system termination of said pending write update session and that said secondary directory is to be updated only with a most recent copy of said update data stored in said second device as indicated by said times of updating, respectively; and then in said secondary data-storage system updating said secondary directory to indicate said most recent copy of said update data.

12. In the method set forth in claim 11, further including machine-executed steps of:

in said primary data processing system generating and maintaining a current time indication for use in generating said times of updating indications;

in said primary data-storage system, for each of said data updates stored in said first device fetching said current time indication for generating said time of updating indication;

in said secondary data-storage system storing said received time of updating indication with said data updates, respectively, into said secondary temporary data storage;

in said secondary data-storage system, responding to said termination of said pending write update session but before updating said secondary directory, sorting the data updates for every set of plural copies of a same data unit in an order of said time of updating indications for identifying a most recent time of updated copy of each respective same data unit, then using identification of said most recent copy of each said data unit for said secondary directory update.

13. The method set forth in claim 12, further including machine-executed steps of:

in said first device establishing a plurality of first subsystems for connecting all of said addressable first data storage devices to said primary data processing system whereby said first data storage devices and said primary temporary data storage can be accessed by any one of said first subsystems;

generating a predetermined set of sequence numbers and assigning a subset of said sequence numbers to respective first subsystems;

in said primary data-storage system assigning one of said sequence numbers to each of said data updates, respectively, for indicating which of said first subsystems transferred said data updates to said primary temporary data storage;

adding each of said sequence numbers to the respective update data being copied to said secondary data-storage system; and in said secondary secondary data-storage system, first sorting the update data indications by said data units, then checking completeness of said sequence numbers and then sorting said update data indications by said time of updating indications for finding and selecting said most recent copy of each said data unit.

14. The method set forth in claim 13, further including machine-executed steps of:

establishing in each said secondary data-storage system a log structured array;

in said log structured array providing N ones of said addressable second data storage devices, N being a positive integer;

in said log structured array, dividing said addressable data-storage locations into a plurality of addressable data-storing segments, making each of said plurality of segments to consist of a column segment in each of said second data storage devices, respectively, wherein addresses of said column segments in any of said N ones of said addressable second data storage devices having identical addresses within the respective N ones of said second addressable data storage devices;

in said log structured array providing data compression means for compressing all data stored in said log structured array;

in said secondary data-storage system, updating said log structured array including writing updated data and all non-updated original data in a new addressable area of said log structured array; and then updating the secondary directory to indicate only said new addressable data.

15. The method set forth in claim 12, further including machine-executed steps of:

in said secondary data-storage system providing a non-volatile random access control memory; and storing said secondary directory in said non-volatile random access control memory.

16. The method set forth in claim 12, further including machine-executed steps of:

storing said sequence numbers in said primary data-processing system, said time of updating indications and identifications of the data units for each copy of data for the respective data units;

responding to said termination of said pending write update session to supply to said secondary data-processing system an indication of a predetermined range of said stored sequence numbers and said time of updating for each said stored sequence number in said predetermined range; and in said secondary data-storage system selecting from said update directory all of said update directory entries having ones of said sequence numbers lying within said range of indications for identifying said most recent copies of the respective data units.

17. The method set forth in claim 16, further including machine-executed steps of:

in said step of establishing said pending write update session, assigning a session ID to said session; and including said session ID with each copy of said update data copied from said primary data-storage system to said secondary data-storage system.

18. A delayed directory updating control apparatus for use with dual mode remote data copy apparatus for transferring updated data between primary and secondary data-storage systems, said primary and secondary data-storage systems having primary and secondary long-term storage comprising first and second peripheral means, respectively, each said peripheral means in both said data-storage systems having a plurality of first and second device addressable data-storage locations for retentively storing data, primary and secondary directories respectively providing addressability of data stored in said first and second peripheral means, said data being arranged in addressable data units that are successively updated by replacing current data with update data in each data unit;

said delayed directory updating control apparatus including, in combination:

pending write update means in said primary data processing system for establishing a pending write update session in which data in the primary data-storage system are updated by update data and are to be copied to said secondary data-storage system wherein said secondary directory is updated after termination of said established pending write update session;

primary data update means in said primary data-storage system and connected to said pending write update means for responding to said pending write update session for repeatedly storing data in said first peripheral means and updating said primary directory to reflect storage of said update data, assigning a time of updating to each update for indicating time that update data are respectively stored in said first peripheral means, system inter-communication terminal means connected to said primary data-storage system and to said pending write update means and being responsive to said pending write update means established pending write update session and to said primary data update means updating data stored in said first peripheral means for receiving for transmittal to said secondary data-storage system a copy of said update data and said time of updating and indicating that said copy of said update data is transmitted as a part of said pending write update session;

consistency means connected to said secondary data-storage system for indicating termination of said pending write update session and that said secondary directory is to be updated with addresses only for a most recent copy of said transmitted update data; and said consistency means further indicating to said system inter-connection terminal means to indicate termination of said pending write update session to said secondary data-storage system for immediately updating said secondary directory only with addresses for said most recent updated copies of said update data.

19. A secondary delayed directory updating system for use in a dual remote data copy apparatus for copying updated data from a primary data-storage system to a secondary data-storage system, said primary and secondary data-storage systems having primary and secondary long-term storage comprising first and second peripheral means, respectively, each said peripheral means in both said data-storage systems having a plurality of first and second device addressable data-storage locations for retentively storing data, primary and secondary directories respectively providing addressability of data stored in said first and second peripheral means;

said delayed directory updating system including, in combination:

an update directory providing addressability of said data copied from said primary data-storage system and stored in said secondary data-storage system; said secondary directory providing addressability of data stored in said secondary data-storage system that are other than said copied data;

system inter-communication terminal means for being connected to said primary data-storage system for receiving from the primary data-storage system update data to be stored in the secondary data-storage system, time of updating indications with said received data and an indication that the received data are in a predetermined pending write update session;

data update means being connected to said system inter-connection terminal means for receiving said update data, said time of updating indications and said indication of a pending update session for storing said received update data, time of updating indication and said pending write update session indication in said primary data-storage system;

said data update means in said secondary data-storage system connected to said update directory and to said system inter-connection terminal means for responding to receiving said update data in said pending write update session for storing said update data in said secondary data-storage system and to update said update directory;

said system inter-communication terminal means supplying an indication of termination of said pending write update session; and connected to said secondary directory, said update directory and to said system inter-connection terminal means for being responsive to said termination indication to sort the time of updating indications, order the indications of said received data in the order of said time of updating indications for indicating a most recent copy of each data unit copied into said secondary data-storage system, selection means in the directory update means for updating said secondary directory using addresses of said most recent copy of each data unit to then be included as a part of said other than said copied data.

20. A data-storage system having means for deferred updating of a directory for said data-storage system, including, in combination:

a plurality of addressable data storage locations for retentively storing data;

directory means for indicating which of said addressable data storage locations are storing data and identification of such data;

input means connected to said addressable data storage locations for repeatedly supplying copies of data units to be stored in said addressable data storage locations;

update means in the data input means for storing in respective ones of said addressable data storage locations said supplied copies of said data units at predetermined ones of said addressable data storage locations and being connected to said directory means for indicating addresses of said addressable data storage locations whereat said copies of said data units are stored;

indication means in the input means for supplying a time stamp with each of said supplied copies of said data units such that a plurality of copies of predetermined ones of said data units each with a different time stamp are supplied by said input means;

logging means in said data input means for storing said time stamps and respective identifications of said supplied and stored copies of data units for pointing to said plurality of copies of the respective data units stored in said addressable data storage locations;

end means in said data input means for indicating that said directory is to be updated to address only those copies of said respective data units having a most recent time stamp and not to store any of said copies of said data units having less recent ones of said time stamps, respectively; and directory update means connected to said end means, to said logging means and to said directory for responding to said indication to sort said time stamps for copies of each said data units for indicating said most recent copy of said data units, respectively, and for updating said directory only with said sorted most recent copy address.

21. In the system set forth in claim 20 further including, in combination:

sequence number means in said data input means for supplying a sequence number for each copy of said supplied data units; and said directory update means having checking means connected to said sequence number means for checking that said supplied sequence numbers are a continuous sequence without any missing sequence numbers, then actuating said directory update means to update said directory.

22. In the system set forth in claim 20 further including, in combination:

said addressable data storage locations comprising a log structured array having N data-storage devices, said array being divided into a plurality of addressable data-storing segments, each of said plurality of segments consisting of a column segment in each of said data-storage devices, respectively, wherein addresses of said column segments in any of said data-storage devices having identical addresses within the respective data-storage devices.

23. In a machine-effected method of storing data in a data-storage system having a plurality of addressable data storage locations, a directory means for addressing data stored in said plurality of addressable data storage locations, including machine-executed steps of:

repeatedly receiving from a data input means copies of data units to be stored in said addressable data storage locations including plural copies of predetermined ones of said data units and receiving a time stamp with each said copy of said data units, each said time stamp having a predetermined time indication;

storing all of said received copies of said data units in respective ones of said addressable data storage locations;

storing each said time stamp and an identification of said data unit and address of said respective ones of said addressable data storage locations in a logging means;

indicating that a directory is to be updated for indicating addresses of a most recent copy of each of said data units as indicated by the respective time stamps;

in said logging means, responding to said update indicating for sorting said indications of all copies for the respective data units by said respective time stamps for identifying the copies of said data units that have a most recent time indication, respectively for each of said data units as identified most-recent copies; and storing said addresses of said identified most recent copies of said data units in said directory such that said directory has addresses only for the most-recent copies of said data units and no addresses for any copy of said data units with a time stamp that is other than said most recent time stamp of the respective data units.

24. In the machine-effected method set forth in claim 23, further including machine-executed steps of:

receiving from said data input means a sequence number with each said copy of said data units with said sequence numbers of all said copies being in predetermined sets of continuous sequences of numbers for indicating that all copies of said data units identified by said sequence numbers in said set have been received; and delaying said sorting of said indications until all said sequence numbers in said set have been received whereby the directory is not updated until all copies indicated by said sequence numbers in said set have been received and stored in said addressable data storage locations.

25. In the machine-effected method set forth in claim 24, further including machine-executed steps of:

providing a log structured array having said addressable data storage locations disposed in N addressable data storage data storage devices, dividing said array into a plurality of data-storing segments, putting a like-predetermined number of said addressable data storage locations in each of said data-storing segments, each of said plurality of segments consisting of a column segment in each of said data storage devices, respectively, wherein addresses of said column segments in any of said devices having identical addresses within the respective data storage devices.

26. A computer program product for backing up data stored in first peripheral means of a primary data-storage system of a primary data processing system into second peripheral means of a secondary data-storage system that is physically independent of said first peripheral means; each said peripheral means in both said data-storage systems having a plurality of first and second device addressable data-storage locations for retentively storing data; said secondary data-storage system further having primary and secondary temporary data storage having temporary addressable data storage; primary and secondary directories respectively providing addressability of data stored in said first and second device;

the computer program product having data storage means containing machine-sensible-and-executable program instructions, which include the following:

program instructions for establishing in said primary data processing system a pending write update session in which data in the primary data-storage system are updated by update data that are to be copied from said primary data-storage system to said secondary data-storage system during said pending write update session;

program instructions responsive to said primary data processing system repeatedly updating data in said primary data-storage system to include during said pending write update session for each one of said data updates in said primary data processing system identifying said data updates as being in said established pending write update session including indicating time of updating of each said data update;

program instructions for establishing an update directory in said secondary data-storage system for providing addressability in said secondary data storage independently of said secondary directory;

program instructions for sending a copy of each said data update during said pending write update session, including the respective indicated time of updating in said established pending write update session, to said secondary data-storage system;

program instructions for responding to receiving said data update and its respective time of updating indication during said pending write update session for storing said data update in said second device and storing said time of updating and an identification of said stored data only in said update directory as respective update directory entries;

program instructions for indicating to said secondary data-storage system termination of said pending write update session and that said secondary directory is to be updated only with a most recent copy of said update data stored in said second device as indicated by said times of updating, respectively; and program instructions for responding to said indicated end of update session for reading said update directory entries for updating said secondary directory to indicate said most recent copy of said update data.

27. A computer program product for delayed updating a secondary directory for use in a dual remote data copy data processing system for copying updated data from a primary data-storage system to a secondary data-storage system, said primary and secondary data-storage systems having primary and secondary long-term storage comprising first and second peripheral means, respectively, each said peripheral means in both said data-storage systems having a plurality of first and second device addressable data-storage locations for retentively storing data, primary and secondary directories respectively providing addressability of data stored in said first and second peripheral means;

said computer program product having a data storage means storing machine-sensible-and-executable program instructions which include:

program instructions to create an update directory for providing addressability of said data copied from said primary data-storage system and stored in said secondary data-storage system;

program instructions for establishing a system inter-communication terminal program for connecting a secondary data storage system to said primary data-storage system for receiving from the primary data-storage system update data to be stored in the secondary data-storage system, time of updating indications with said received data and an indication that the received data are in a predetermined pending write update session;

program instructions for creating a data update program connected to said system inter-connection terminal program for receiving said update data, said time of updating indications and said indication of a pending update session for storing said received update data, time of updating indication and said pending write update session indication in said primary data-storage system;

program instructions for interconnecting said data update program in said secondary data-storage system to said update directory and to said system inter-connection terminal program for responding to receiving said update data in said pending write update session for storing said update data in said secondary data-storage system and to update said update directory;

program instructions for supplying an indication of termination of said pending write update session;

program instructions responding to said termination indication to read said update directory to sort said time of updating indications, order the indications of said received data in the order of said time of updating indications for indicating a most recent copy of said data units copied into said secondary data-storage system; and program instructions for updating said secondary directory using addresses of said most recent copy of each said data unit indicated in said update directory to then be included as a part of said other than said copied data.

28. A computer program product for controlling storing data in a data-storage system having a plurality of addressable data storage locations, a directory means for addressing data stored in said plurality of addressable data storage locations;

said computer program product having data storage means containing machine-sensible-and-executable program instructions which include the following:

program instructions for repeatedly receiving from a data input means copies of data units to be stored in said addressable data storage locations including plural copies of predetermined ones of said data units and receiving a time stamp with each said copy of said data units, each said time stamp having a predetermined time indication;

program instructions for storing all of said received copies of said data units in respective ones of said addressable data storage locations;

program instructions for storing each said time stamp and an identification of said data unit and address of said respective ones of said addressable data storage locations in a log;

program instructions for indicating that a directory is to be updated for indicating addresses of a most recent copy of each of said data units as indicated by the respective time stamps;

program instructions for responding to said indicating that said directory is to be updated to access said log for sorting said indications of all copies for the respective data units by said respective time stamps for identifying the copies of said data units that have a most recent time indication, respectively for each of said data units as identified most-recent copies; and program instructions for storing said addresses of said identified most recent copies of said data units in said directory such that said directory has addresses only for the most-recent copies of said data units and no addresses for any copy of said data units with a time stamp that is other than said most recent time stamp of the respective data units.

* * * * *

UNITED STATES PATENT AND TRADEMARK OFFICE
CERTIFICATE OF CORRECTION

PATENT NO. : 5,555,371
DATED : September 10, 1996
INVENTOR(S) : Linda Marie DUYANOVICH, William Frank MICKA and Robert Wesley SHOMLER It is certified that error appears in the above-indentified patent and that said Letters Patent is hereby corrected as shown below:

On the title page, item [56]

REFERENCES CITED:

5,214,670   should be   5,241,670

Signed and Sealed this

Twenty-fourth Day of December, 1996

Attest:

BRUCE LEHMAN

*Attesting Officer*      *Commissioner of Patents and Trademarks*